(12) United States Patent
Bickel et al.

(10) Patent No.: US 11,695,427 B2
(45) Date of Patent: Jul. 4, 2023

(54) SYSTEMS AND METHODS FOR OPTIMIZING WAVEFORM CAPTURE COMPRESSION AND CHARACTERIZATION

(71) Applicant: Schneider Electric USA, Inc., Andover, MA (US)

(72) Inventors: Jon A. Bickel, Murfreesboro, TN (US); Colton Thomas Peltier, Murfreesboro, TN (US)

(73) Assignee: Schneider Electric USA, Inc., Boston, MA (US)

( * ) Notice: Subject to any disclaimer, the term of this patent is extended or adjusted under 35 U.S.C. 154(b) by 0 days.

(21) Appl. No.: 17/522,170

(22) Filed: Nov. 9, 2021

(65) Prior Publication Data
US 2022/0200627 A1 Jun. 23, 2022

Related U.S. Application Data

(60) Provisional application No. 63/170,393, filed on Apr. 2, 2021, provisional application No. 63/162,321, filed
(Continued)

(51) Int. Cl.
H03M 7/30 (2006.01)
(52) U.S. Cl.
CPC ..................... *H03M 7/60* (2013.01)
(58) Field of Classification Search
CPC .............................. H03M 7/60; H03M 7/607
See application file for complete search history.

(56) References Cited

U.S. PATENT DOCUMENTS

2006/0212238 A1 9/2006 Nisenblat et al.
2011/0112779 A1 5/2011 Tse et al.
(Continued)

FOREIGN PATENT DOCUMENTS

CN 108469561 A 8/2018

OTHER PUBLICATIONS

Tcheou, Michel P. et al., "The Compression of Electric Signal Waveforms for Smart Grids: State of the Art and Future Trends", IEEE Transactions on Smart Grid, vol. 5, No. 1, Jan. 1, 2014, pp. 291-302.
(Continued)

Primary Examiner — Lam T Mai
(74) Attorney, Agent, or Firm — Locke Lord LLP

(57) ABSTRACT

A method to automatically optimize waveform captures from an electrical system includes capturing at least one energy-related waveform using at least one Intelligent Electronic Device (IED) in the electrical system. The at least one captured energy-related waveform is analyzed to determine if the at least one captured energy-related waveform is capable of being compressed, while maintaining relevant attributes for characterization, analysis and/or other use. In response to determining the at least one captured energy-related waveform is capable of being compressed, while maintaining relevant attributes for characterization, analysis, and/or use, the at least one captured energy-related waveform may be compressed using at least one compression technique to generate at least one compressed energy-related waveform. One or more actions may be taken based on or using the at least one compressed energy-related waveform.

38 Claims, 10 Drawing Sheets

Related U.S. Application Data on Mar. 17, 2021, provisional application No. 63/127,257, filed on Dec. 18, 2020.

(56) References Cited

U.S. PATENT DOCUMENTS

| | | | | |
|---|---|---|---|---|
| 2012/0314540 A1* | 12/2012 | Alter | ......................... | E21D 5/06 |
| | | | | 405/272 |
| 2020/0393501 A1* | 12/2020 | Menzel | .................. | G01R 23/16 |
| 2022/0091166 A1* | 3/2022 | Bickel | ............... | H02J 13/00002 |
| 2022/0200281 A1* | 6/2022 | Bickel | ..................... | H02J 3/001 |

OTHER PUBLICATIONS

European Search Report and Search Opinion dated Aug. 10, 2022 for corresponding European Patent Application No. 22161589.1, 11 pages.

* cited by examiner

SYSTEMS AND METHODS FOR OPTIMIZING WAVEFORM CAPTURE COMPRESSION AND CHARACTERIZATION

CROSS REFERENCE TO RELATED APPLICATIONS

This application claims the benefit of and priority to U.S. Provisional Application No. 63/127,257, filed on Dec. 18, 2020, U.S. Provisional Application No. 63/162,321, filed on Mar. 17, 2021, and U.S. Provisional Application No. 63/170,393, filed on Apr. 2, 2021, which applications were filed under 35 U.S.C. § 119(e) and are incorporated by reference herein in their entirety.

FIELD

This disclosure relates generally to electrical/power systems, and more particularly, to systems and methods for optimizing waveform captures from electrical systems, for example, in meters, breakers, relays, Intelligent Electronic Devices (IEDS) and/or other devices in and/or associated with the electrical systems.

BACKGROUND

As is known, meters, breakers, relays, Intelligent Electronic Devices (IEDS) and/or other devices may be used to generate waveform captures, and/or to collect data that may be used to generate waveform captures, in an electrical system. The waveform captures may be measurements and recordings of voltage and/or current signals that can be triggered using many methods including: manually, automatically after exceeding one or more parameter threshold(s), periodically (e.g., at 12:00 pm daily), initiated by an external input (e.g., change in digital status input signal), or by some other means. The waveform captures may also include other internal/external information such as status input changes, data from other devices, equipment and/or systems. A device capturing waveform information from six channels with a length of ten cycles and a sample rate of one thousand twenty-four samples/cycles/channels, for example, may result in a file of approximately one hundred twenty kilobytes (KB). During the normal operation of an electrical/power monitoring system (EPMS) over time, for example, many waveform captures will be obtained from multiple channels and multiple devices, potentially generating gigabytes to terabytes of data to be stored, maintained, retrieved, analyzed, and so forth. As is known, data storage may be expensive and having too much data can slow down processing, analysis, etc. of the data collected and stored.

SUMMARY

Described herein are systems and methods for automatically optimizing waveform captures from electrical systems, for example, so memory is preserved (e.g., both on-board the device(s) performing the waveform captures and in databases), communications bandwidth is reduced, and processing time is decreased, all while ensuring the necessary data/information (e.g., required signal information, metadata, etc.) is available for characterization, analysis and/or other use. The electrical systems in which the device(s) performing the waveform captures are provided, and in which the waveforms are captured, may be associated with at least one load, process, building, facility, watercraft, aircraft, or other type of structure, for example. Additionally, the device(s) performing the waveform captures may be part of an Electric Power monitoring systems (EPMS) responsible for monitoring and/or controlling the electrical systems, for example.

In one aspect of this disclosure, a method to automatically optimize waveform captures from an electrical system (e.g., in one or more Intelligent Electronic Devices (IEDs), Edge device(s), the Cloud, Gateway(s), etc.), for example, to optimize waveform compression and characterization, includes capturing at least one energy-related waveform using at least one IED (and/or other waveform capture device) in the electrical system. The at least one captured energy-related waveform may be analyzed (e.g., in real-time, pseudo-real time, or historically) to determine if the at least one captured energy-related waveform is capable of being compressed, while maintaining relevant attributes for characterization, analysis and/or other use. In response to determining the at least one captured energy-related waveform is capable of being compressed, while maintaining relevant attributes for characterization, analysis, and/or use, the at least one captured energy-related waveform may be compressed using at least one compression technique to generate at least one compressed energy-related waveform. One or more actions may be taken or performed, for example, based on or using the at least one compressed energy-related waveform.

It is understood that the at least one captured energy-related waveform may be analyzed and optimized substantially anywhere, for example, including in the at least one IED responsible for capturing the at least one captured energy-related waveform. It is also understood that the at least one captured energy-related waveform can also be sent as the uncompressed capture(s) (also, sometimes referred to as uncompressed waveform capture(s)) to the Edge, Gateway, and/or Cloud and be optimized there. The optimization can also be performed on non-proprietary waveform capture(s). It is understood that in accordance with various aspects of this disclosure, the focus of the disclosed invention is on the compression itself; not so much where it occurs.

In accordance with some embodiments of this disclosure, prior to compressing the at least one captured energy-related waveform, it is determined if it is beneficial to compress the at least one captured energy-related waveform. In one example implementation, the determination of whether it is beneficial or not beneficial to compress the at least one captured energy-related waveform is based on load type(s), load mix, process(es), application(s), customer type/segment, etc. In response to determining it is beneficial to compress the at least one captured energy-related waveform, the at least one captured energy-related waveform may be compressed using the at least one compression technique to generate the at least one compressed energy-related waveform, for example. Additionally, in response to determining it is not beneficial to compress the at least one captured energy-related waveform, the at least one captured energy-related waveform may not be compressed. In accordance with some embodiments of this disclosure, in instances in which the waveform is not compressed (e.g., in response to determining the at least one captured energy-related waveform is not capable of being compressed or it is not beneficial to compress the at least one captured energy-related waveform), metadata on the analysis performed may be attached/appended to the uncompressed waveform, data indicative of the uncompressed waveform, data including the uncompressed waveform, and/or any pertinent information about the uncompressed waveform that is useful/interesting to the end-user (e.g., based on the application, for example, motor diagnostics). This would prevent, for example, the spectral analysis from needing to be performed again in the future.

In some embodiments, one or more actions may be taken or performed based on or using the at least one captured energy-related waveform and/or the at least one compressed energy-related waveform. For example, the at least one captured energy-related waveform and/or the at least one compressed energy-related waveform may be stored, displayed, and/or analyzed. In some embodiments, one or more actions may be taken or performed based on or in response to the analysis of the at least one captured energy-related waveform and/or the at least one compressed energy-related waveform, for example, as will be appreciated from further discussions below.

In accordance with some embodiments of this disclosure, compressing the at least one captured energy-related waveform includes downsampling, resampling, reproducing, rebuilding, and/or reconstituting the at least one compressed energy-related waveform from the at least one captured energy-related waveform. In some embodiments, the at least one compression technique (e.g., to downsample, resample, reproduce, rebuild, and/or reconstitute the at least one compressed energy-related waveform) is automatically selected to optimize the degree of compression with the amount of error. Error may be defined by purely the difference between the compressed waveform(s) and the uncompressed waveform(s) (for example, using the Sum of Squared errors or other technique) or it may be defined more specifically by the relevant characteristics of the waveform. For example, if select harmonics of the one or more waveform(s) are relevant for the type of the waveform or its useful applications the error may be measured by how well those harmonics are preserved in the compressed one or more waveform(s). Additionally, in some embodiments, the at least one compression technique is selected based on at least one of one or more user-defined parameters or automatically determined based on the configuration of an IED device (e.g., for example, in the case of a relay in motor diagnostic mode, we may be able to infer what is important/relevant for the waveforms automatically). The user-defined parameters may include, for example, at least one of: desired amount of error, desired degree of compression, desired memory reduction, desired cost savings, desired processing gain, selected composite frequencies, load type(s), customer type/segment, etc. . . . (from above), relevant characteristics, important traits, and anomalous conditions of interest to be detected using the at least one compressed energy-related waveform.

In some embodiments, the user-defined parameters that may be used to determine/select the at least one compression technique may be constrained by what is reasonable, acceptable and/or possible/achievable. Additionally, in some embodiments the user-defined parameters may be ranked by the end-user from most important to least important to the end-user, and the at least one compression technique is selected based, at least in part, on this ranking. It is understood that the user-defined parameters may be selected on a user interface (e.g., of a user-device, IED, PC, etc.) and/or other means, for example, as will be appreciated from further discussions below.

In accordance with further embodiments of this disclosure, the at least one compression technique may be selected based, at least in part, on whether the at least one captured energy-related waveform is periodic or aperiodic. For example, the at least one captured energy-related waveform may be analyzed and it may be determined if the at least one captured energy-related waveform is periodic (a signal, with random noise, which is has repeating values after a fixed length of time) or aperiodic (a signal, which may include noise, which does not repeat itself after a fixed interval of time, typically triggered by an electrical perturbation(s) or externally triggered event(s)). In one example implementation, in response to determining the at least one captured energy-related waveform is periodic, the at least one compressed energy-related waveform may be generated by downsampling, resampling, reproducing, rebuilding, and/or reconstituting a subset of the at least one captured energy-related waveform (e.g., taking a subset of the at least one captured energy-related waveform and reusing its information to generate the at least one compressed energy-related waveform). Additionally, in one example implementation, in response to determining the at least one captured energy-related waveform is aperiodic, it may be determined whether there are any periodic portions contained within the aperiodic waveform capture of the at least one captured energy-related waveform.

In one example implementation, in response to determining there are periodic portions of the aperiodic at least one captured energy-related waveform, one or more first compression techniques may be selected to compress periodic portions of the aperiodic at least one captured energy-related waveform. Additionally, one or more second compression techniques may be selected to compress aperiodic portions of the aperiodic at least one captured energy-related waveform, with the first and second compression techniques corresponding to the above and below discussed at least one compression technique. In some embodiments, the first and second compressions techniques may be the same as or similar to each other. Additionally, in some embodiments the first and second compressions techniques are different from each other. One example of a compression technique that may be used is the Singular-Value Decomposition (SVD). Using the SVD is a useful technique to achieve compression for many types of data. The SVD is suitable for our use cases because it exists for any data matrix. In the case of a real data matrix, X (with m rows and n columns, m×n), the SVD decomposes the data matrix into 3 matrices such that:

$$X = U\Sigma V^T$$

Where U (m×m) and V (n×n) are unitary and orthogonal. $\Sigma$ is a diagonal real matrix which contains the real, non-negative, singular values of X. The size of the singular values can be interpreted as the importance of each singular value. By keeping the larger singular values and discarding the smaller ones a compressed representation of X can be created.

In some embodiments, prior to selecting the one or more first compression techniques to compress periodic portions of the aperiodic at least one captured energy-related waveform, and selecting the one or more second compression techniques to compress aperiodic portions of the aperiodic at least one captured energy-related waveform, it may be determined if it is beneficial or desirable to apply same, similar or different compression techniques to compress the periodic and the aperiodic portions of the aperiodic at least one captured energy-related waveform. The determination of whether it is beneficial or desirable to apply same, similar or different compression techniques to compress the periodic and the aperiodic portions of the aperiodic at least one captured energy-related waveform may be application and/or customer specific, for example. It is understood that in some instances it may not be desirable to decompose (splitup) the event even if there are periodic and aperiodic events. This could be based upon the application or desired compression parameters, for example. Or, for some compression techniques it may not be necessary to decompose periodic and aperiodic events.

As previously noted, the above method to automatically optimize waveform captures from an electrical system may include taking one or more actions based on or using the at least one compressed energy-related waveform. In accordance with some embodiments of this disclosure, the one or more actions taken or performed based on or using the at least one compressed energy-related waveform include at least one of: storing the at least one compressed waveform, displaying the at least one compressed waveform, analyzing the at least one compressed waveform, and performing actions based on or in response to the analyzing of the at least one compressed waveform. In embodiments in which the at least one compressed waveform is stored, it is understood that the at least one compressed waveform may be stored locally (e.g., on at least one local storage device) and/or remotely (e.g., on cloud-based storage), for example, based on a user-configured preference. For example, a user may indicate their preference to store the at least one compressed waveform locally and/or remotely in a user interface (e.g., of a user device), and the at least one compressed waveform may be stored based on the user-configured preference. It is understood that the location(s) in which the at least one compressed waveform is/are stored may be based on a variety of other factors including customer type(s)/segment(s), process(es), memory requirements, cost(s), etc.

It is also understood that in some embodiments it may be desirable to store both the at least one compressed waveform and the at least one captured waveform (i.e., the uncompressed waveform(s)). In one example implementation, the at least one compressed waveform may be stored in at least a first location (e.g., on at least a first storage device), and the at least one captured waveform may be stored in at least a second location (e.g., on at least a second storage device). In some embodiments, the first and second locations may be different locations. Additionally, in some embodiments the first and second locations are same locations.

In some embodiments, the at least one compressed waveform and/or associated metrics, traits, characteristics, metadata, etc. of the at least one compressed waveform may be displayed, for example, on a user interface (e.g., of a user-device, IED, software, etc.). In one example implementation, the at least one compressed waveform is presented alongside or superimposed over the at least one captured waveform to illustrate similarities between the at least one compressed waveform and the at least one captured waveform displayed on the user interface.

In some embodiments, the at least one compressed waveform is analyzed, for example, to identify, analyze, display, and monitor/track anomalous conditions in the electrical system. Additionally, in some embodiments at least one action may be performed in response to analysis of the at least one compressed waveform. For example, in embodiments in which the at least one compressed waveform is analyzed to identify and monitor/track anomalous conditions in the electrical system, the at least one action may include at least one of: identifying cause(s) of the identified anomalous conditions and providing mitigation recommendations to address or reduce the identified anomalous conditions. In these embodiments, the relevant attributes for characterization, analysis and/or other use that are used in the determination of whether the at least one captured energy-related waveform is capable of being compressed, while maintaining relevant attributes for characterization, analysis and/or other use, include characteristics (e.g., most relevant and/or important characteristics) suitable for detecting and characterizing anomalous conditions (e.g., transient events or chronic conditions and other power quality events) in the electrical system. These characteristics may include, for example, at least one of: magnitude, duration, frequency components, sag type, and other relevant information associated with the at least one captured waveform.

In accordance with some embodiments of this disclosure, the above method (and the other methods and systems discussed below) may be implemented on one or more waveform capture devices (e.g., IEDs), for example, on the at least one IED responsible for capturing the at least one energy-related waveform. Additionally, in some embodiments the above method (and the other methods and systems discussed below) may be implemented partially or fully remote from the at least one IED, for example, in a gateway, a cloud-based system, on-site software, a remote server, etc. (which may alternatively be referred to as a "head-end" or "Edge" system herein). Examples of the at least one IED may include a smart utility meter, a power quality meter, and/or another measurement device (or devices). The at least one IED may include breakers, relays, power quality correction devices, uninterruptible power supplies (UPSs), filters, and/or variable speed drives (VSDs), for example. Additionally, the at least one IED may include at least one virtual meter in some embodiments.

It is understood that the at least one energy-related waveform capture described in connection with the above method (and the other methods and systems discussed below) may be associated with energy-related signals captured or measured by the at least one IED. For example, in accordance with some embodiments of this disclosure, the at least one energy-related waveform capture may be generated from at least one energy-related signal captured or measured by the at least one IED. According to IEEE Standard 1057-2017, for example, a waveform is "[a] manifestation or representation (e.g., graph, plot, oscilloscope presentation, discrete time series, equations, table of coordinates, or statistical data) or a visualization of a signal." With this definition in mind, the at least one energy-related waveform may correspond to a manifestation or representation or a visualization of the at least one energy-related signal. It is understood that the above relationship is based on one standards body's (IEEE in this case) definition of a waveform, and other relationships between a waveform and a signal are of course possible, as will be understood by one of ordinary skill in the art.

It is understood that the energy-related signals or waveforms captured or measured by the at least one IED discussed above may include, for example, at least one of: a voltage signal, a current signal, input/output (I/O) data, and a derived or extracted value. In some embodiments, the I/O data includes at least one of a digital signal (e.g., two discrete states) and an analog signal (e.g., continuous variable). The digital signal may include, for example, at least one of on/off status(es), open/closed status(es), high/low status(es), synchronizing pulse and any other representative bi-stable signal. Additionally, the analog signal may include, for example, at least one of temperature, pressure, volume, spatial, rate, humidity, and any other physically or user/usage representative signal.

In accordance with some embodiments of this disclosure, the derived or extracted value includes at least one of a calculated, computed, estimated, derived, developed, interpolated, extrapolated, evaluated, and otherwise determined additional energy-related value from at least one of the measured voltage signal and/or the measured current signal. In some embodiments, the derived value additionally or alternatively includes at least one of active power(s), apparent power(s), reactive power(s), energy(ies), harmonic distortion(s), power factor(s), magnitude/direction of harmonic power(s), harmonic voltage(s), harmonic current(s), interharmonic current(s), interharmonic voltage(s), magnitude/direction of interharmonic power(s), magnitude/direction of sub-harmonic power(s), individual phase current(s), phase angle(s), impedance(s), sequence component(s), total voltage harmonic distortion(s), total current harmonic distortion(s), three-phase current(s), phase voltage(s), line voltage(s), spectral analysis and/or other similar/related parameters. In some embodiments, the derived value additionally or alternatively includes at least one energy-related characteristic, the energy-related characteristic including magnitude, direction, phase angle, percentage, ratio, level, duration, associated frequency components, energy-related parameter shape, decay rate, and/or growth rate. In accordance with some embodiments of this disclosure, the derived or extracted value may be linked to at least one process, load(s) identification, etc., for example.

It is understood that the energy-related signals or waveforms captured or measured by the at least one IED may include (or leverage) substantially any electrical parameter derived from at least one of the voltage and current signals (including the voltages and currents themselves), for example. It is also understood that the energy-related signals or waveforms may be continuously or semi-continuously/periodically captured/recorded and/or transmitted and/or logged by the at least one IED. As noted above, the at least one captured energy-related waveform may be analyzed (e.g., in real-time, pseudo-real time, or historically) to determine if the at least one captured energy-related waveform is capable of being compressed, while maintaining relevant attributes for characterization, analysis and/or other use.

A system to automatically optimize waveform captures from an electrical system (e.g., in one or more IEDs, Edge, Cloud, Gateway, etc.) is also provided herein. In one aspect of this disclosure, the system includes at least one processor and at least one memory device (e.g., local and/or remote memory device) coupled to the at least one processor. The at least one processor and the at least one memory device are configured to capture at least one energy-related waveform using at least one IED (and/or other waveform capture device) in the electrical system. The at least one captured energy-related waveform is analyzed to determine if the at least one captured energy-related waveform is capable of being compressed, while maintaining relevant attributes for characterization, analysis and/or other use. In response to determining the at least one captured energy-related waveform is capable of being compressed, while maintaining relevant attributes for characterization, analysis, and/or use, the at least one captured energy-related waveform may be compressed using at least one compression technique to generate at least one compressed energy-related waveform. In accordance with some embodiments of this disclosure, one or more actions may be taken or performed based on or using the at least one compressed energy-related waveform and/or the at least one captured energy-related waveform, for example, as noted above in conjunction with the above-discussed method.

In some embodiments, the at least one IED capturing the energy-related waveforms includes at least one metering device. The at least one metering device may correspond, for example, to at least one metering device in the electrical system for which the energy-related waveforms are being captured/monitored.

As used herein, an IED is a computational electronic device optimized to perform one or more functions. Examples of IEDs may include smart utility meters, power quality meters, microprocessor relays, digital fault recorders, and other metering devices. IEDs may also be imbedded in VSDs, uninterruptible power supplies (UPSs), circuit breakers, relays, transformers, or any other electrical apparatus. IEDs may be used to perform measurement/monitoring and control functions in a wide variety of installations. The installations may include utility systems, industrial facilities, warehouses, office buildings or other commercial complexes, campus facilities, computing co-location centers, data centers, power distribution networks, or any other structure, process or load that uses electrical energy. For example, where the IED is an electrical power monitoring device, it may be coupled to (or be installed in) an electrical power transmission or distribution system and configured to sense/measure and store data (e.g., waveform data, logged data, I/O data, etc.) as electrical parameters representing operating characteristics (e.g., voltage, current, waveform distortion, power, etc.) of the electrical distribution system. These parameters and characteristics may be analyzed by a user to evaluate potential performance, reliability and/or power quality-related issues, for example. The IED may include at least a controller (which in certain IEDs can be configured to run one or more applications simultaneously, serially, or both), firmware, a memory, a communications interface, and connectors that connect the IED to external systems, devices, and/or components at any voltage level, configuration, and/or type (e.g., AC, DC). At least certain aspects of the monitoring and control functionality of an IED may be embodied in a computer program that is accessible by the IED.

In some embodiments, the term "IED" as used herein may refer to a hierarchy of IEDs operating in parallel and/or tandem/series. For example, an IED may correspond to a hierarchy of a plurality of energy meters, power meters, and/or other types of resource meters. The hierarchy may comprise a tree-based hierarchy, such a binary tree, a tree having one or more child nodes descending from each parent node or nodes, or combinations thereof, wherein each node represents a specific IED. In some instances, the hierarchy of IEDs may share data or hardware resources and may execute shared software. It is understood that hierarchies may be non-spatial such as billing hierarchies where IEDs grouped together may be physically unrelated.

It is understood that an input is data that a processor and/or IED (e.g., the above-discussed plurality of IEDs) receives, and an output is data that a processor and/or IED sends. Inputs and outputs may either be digital or analog. The digital and analog signals may be both discrete variables (e.g., two states such as high/low, one/zero, on/off, etc. If digital, this may be a value. If analog, the presence of a voltage/current may be considered by the system/IED as an equivalent signal) or continuous variables (e.g., continuously variable such as spatial position, temperature, pressure voltage, etc.). They may be digital signals (e.g., measurements in an IED coming from a sensor producing digital information/values) and/or analog signals (e.g., measurements in an IED coming from a sensor producing analog information/values). These digital and/or analog signals may include any processing step within the IED (e.g., derive an active power (kW), power factor, a magnitude, a relative phase angle, among all the derived calculations).

Processors and/or IEDs may convert/reconvert digital and analog input signals to a digital representation for internal processing. Processors and/or IEDs may also be used to convert/reconvert internally processed digital signals to digital and/or analog output signals to provide some indication, action, or other response (such as an input for another processor/IED). Typical uses of digital outputs may include signaling relays to open or close breakers or switches, signaling relays to start or stop motors and/or other equipment, and operating other devices and equipment that are able to directly interface with digital signals. Digital inputs are often used to determine the operational status/position of equipment (e.g., is a breaker open or closed, etc.) or read an input synchronous signal from a utility pulsed output. Analog outputs may be used to provide variable control of valves, motors, heaters, or other loads/processes in energy management systems. Finally, analog inputs may be used to gather variable operational data and/or in proportional control schemes.

A few more examples where digital and analog I/O data are leveraged may include (but not be limited to): turbine controls, plating equipment, fermenting equipment, chemical processing equipment, telecommunications, equipment, precision scaling equipment, elevators and moving sidewalks, compression equipment, waste water treatment equipment, sorting and handling equipment, plating equipment temperature/pressure data logging, electrical generation/transmission/distribution, robotics, alarm monitoring and control equipment, as a few examples.

As noted earlier in this disclosure, the energy-related signals captured/measured by the at least one IED may include I/O data. It is understood that the I/O data may take the form of digital I/O data, analog I/O data, or a combination digital and analog I/O data. The I/O data may convey status information, for example, and many other types of information, as will be apparent to one of ordinary skill in the art from discussions above and below.

It is understood that the terms "processor" and "controller" are sometimes used interchangeably herein. For example, a processor may be used to describe a controller. Additionally, a controller may be used to describe a processor.

Another example method to automatically optimize waveform captures in accordance with embodiments of this disclosure includes capturing at least one waveform using at least one waveform capture device, and analyzing the captured at least one waveform to determine if the at least one captured waveform is capable of being compressed, while maintaining relevant attributes for characterization, analysis and/or other use. In response to determining the at least one captured waveform is capable of being compressed, while maintaining relevant attributes for characterization, analysis, and/or use, the at least one captured waveform may be using at least one compression technique to generate at least one compressed waveform. One or more actions may be taken or performed based on or using the at least one compressed waveform.

It is understood that the above example method may include one or more of the features discussed above in connection with earlier described systems and methods. For example, it is understood that the at least one captured waveform may be analyzed and optimized substantially anywhere, for example, including in the at least one waveform capture device (e.g., IED) responsible for capturing the at least one captured waveform. It is also understood that the at least one captured waveform can also be sent as the uncompressed capture(s) (also, sometimes referred to as uncompressed waveform capture(s)) to the Edge, Gateway, and/or Cloud and be optimized there, etc. Other like embodiments and variations thereof of the above method will be understood by one of ordinary skill in the art.

As will be further appreciated from discussions below, the disclosed systems and methods provide a number of benefits. For example, example benefits provided by optimizing waveform capture data using the systems and methods disclosed herein include:

Resizing of waveform captures from discrete meters, breakers, and relays (or any other IED) for each individual event;

Reducing the memory requirements of waveforms to the minimum useful size for an event and given IED;

Decreasing the communications bandwidth required for transmitting/conveying often sizable waveform files;

Minimizing the total memory storage requirements of waveforms on-board IEDs, in software (S/W), and in cloud-based applications to better facilitate moving, storing, retrieval and processing of the waveform data;

Auto-sizing/configuring discrete waveform capture to make IEDs more user-friendly and less prone to erroneous setup and data loss; and Providing a competitive differentiator for High-end Platforms (e.g., ION8000, ION9000, ION9000T, etc. by Schneider Electric), i.e., meters that capture waveforms.

It is understood that in accordance with some embodiments of this disclosure, the disclosed systems and methods decrease the memory requirements/size of event waveform capture files without losing important/relevant content/information contained in the energy signal-related waveform capture. In accordance with some embodiments of this disclosure, this reduction is based on the respective use case(s) for the waveform data.

It is understood that waveform captures are often limited by real (i.e., actual) or artificial (e.g., self-imposed or user-defined) memory constraints. Therefore, the configuration of waveform capture events is often determined by several factors including the IED's sample rate, duration of the waveform capture, number of channels capturing data, and/or some other related internal or external parameter. By optimizing waveform captures at the IED, it is possible prioritize the information contained within the waveform signal over real or artificial constraints such as the IED's memory.

One feature of this invention is not to prioritize or fix the allotted memory associated with a waveform capture, but to allow an IED to obtain the relevant waveform capture pre-event, event, and post-event data associated with the event. This means letting the sample rates and the length (duration) of the waveform capture be as long as necessary to capture all important aspects of the event in its entirety. The uncompressed waveform capture may then be compressed to a smaller size than the original approach would have been; however, it will still contain more relevant information (in most cases) related to the event because more event recovery data will be available (e.g., more post-event data, more spectral data, etc.). This optimization of the waveform capture data provides the information required to more quickly analyze, troubleshoot, and resolve issues while reducing the waveform capture size through intelligent compression.

One of the benefits of this invention is to pre-process waveforms to characterize them (in order to compress them). This pre-processing may be useful to reduce processing at a later time, which will reduce the overall processing over the life of the waveform capture. This is because once the waveform is characterized for compression, it does not necessarily have to be recharacterized again (because the data is made available in the compressed waveform capture data).

It is understood that there are many other features, advantages and aspects associated with the disclosed invention, as will be appreciated from the discussions below.

BRIEF DESCRIPTION OF THE DRAWINGS

The foregoing features of the disclosure, as well as the disclosure itself may be more fully understood from the following detailed description of the drawings, in which.

DETAILED DESCRIPTION

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected.

For convenience, certain introductory concepts and terms used in the specification (and adopted from IEEE Standard 1159-2019) are collected here.

As used herein, the term "periodic event" is used to describe a non-random, non-arbitrary, planned, expected, intentional, or predicable electrical event. A periodic event typically occurs at regular or semi-regular intervals. It is understood that periodic waveforms may not be related to a particular electrical "event". For example, the "steady state" operation of a system will produce waveforms with repeating or recurring values and noise (i.e., periodic waveforms).

As used herein, the term "aperiodic event" is used to describe a random, arbitrary, unplanned, unexpected, unintentional, or unpredicted electrical event (e.g., voltage sag, voltage swell, voltage transient, and even voltage interruption). An aperiodic event typically occurs non-cyclically, arbitrarily or without specific temporal regularity. For the sake of this disclosure, transients and voltage sags are considered to be aperiodic events (i.e., notching is considered as a harmonic phenomenon).

As used herein, the term "transient" is used to describe a deviation of the voltage and/or current from the nominal value with a duration typically less than 1 cycle. Subcategories of transients include impulsive (uni-direction polarity) and oscillatory (bi-directional polarity) transients.

Figure 1:
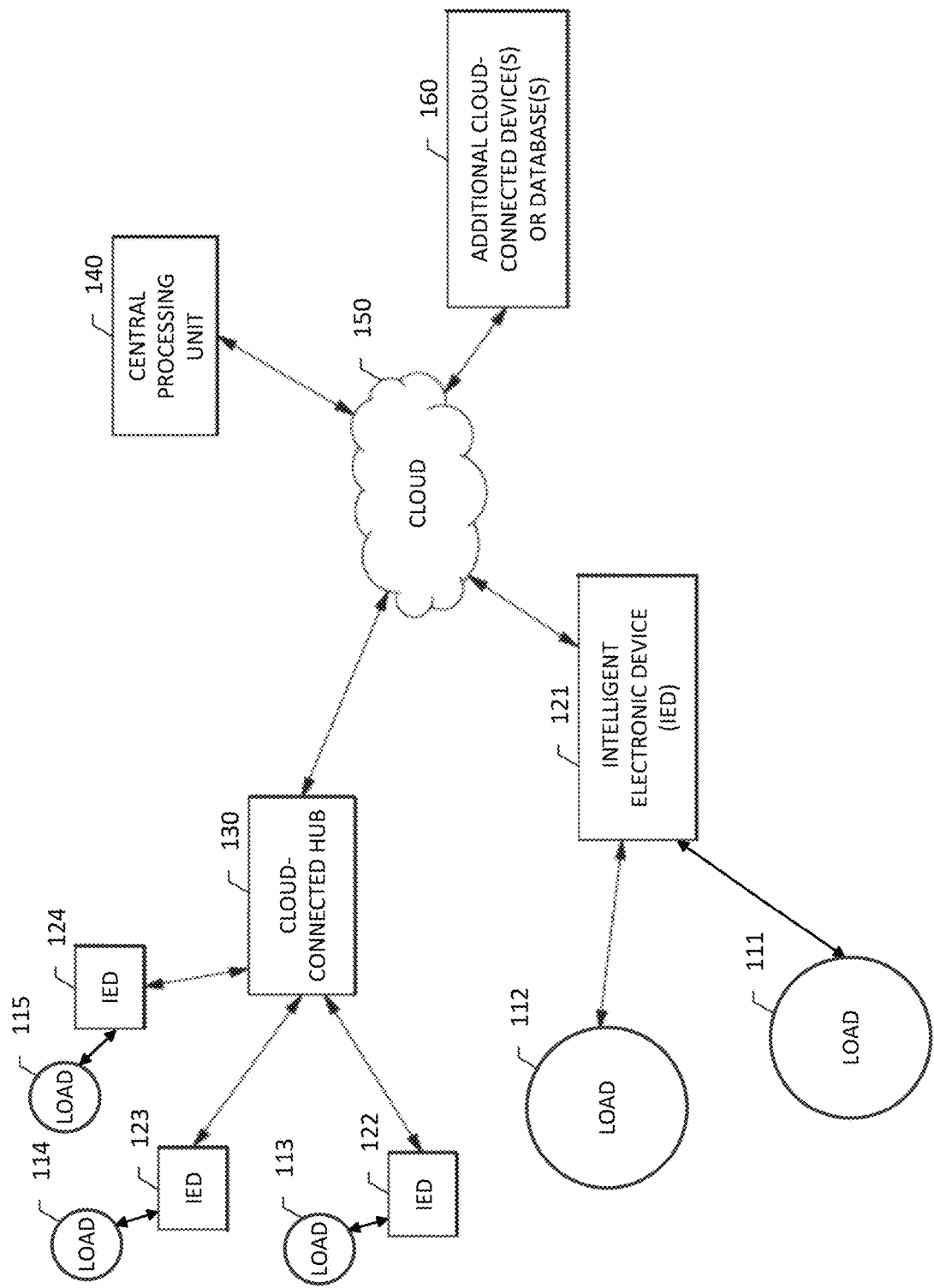
FIG. 1 shows an example electrical system in accordance with embodiments of the disclosure.

Referring to FIG. 1, an example electrical system in accordance with embodiments of the disclosure includes one or more loads (here, loads 111, 112, 113, 114, 115) (also sometimes referred to herein as "equipment" or "apparatuses") and one or more intelligent electronic devices (IEDs) (here, IEDs 121, 122, 123, 124) capable of sampling, sensing or monitoring one or more parameters (e.g., power monitoring parameters) associated with the loads. In embodiments, the loads 111, 112, 113, 114, 115 and IEDs 121, 122, 123, 124 may be installed in one or more buildings or other physical locations or they may be installed on one or more processes and/or loads within a building. The buildings may correspond, for example, to commercial, industrial or institutional buildings.

As shown in FIG. 1, the IEDs 121, 122, 123, 124 are each coupled to one or more of the loads 111, 112, 113, 114, 115 (which may be located "upline" or "downline" from the IEDs in some embodiments). The loads 111, 112, 113, 114, 115 may include, for example, machinery or apparatuses associated with a particular application (e.g., an industrial application), applications, and/or process(es). The machinery may include electrical or electronic equipment, for example. The machinery may also include the controls and/or ancillary equipment associated with the equipment.

In embodiments, the IEDs 121, 122, 123, 124 may monitor and, in some embodiments, analyze parameters (e.g., energy-related parameters) associated with the loads 111, 112, 113, 114, 115 to which they are coupled. The IEDs 121, 122, 123, 124 may also be embedded within the loads 111, 112, 113, 114, 115 in some embodiments. According to various aspects, one or more of the IEDs 121, 122, 123, 124 may be configured to monitor utility feeds, including surge protective devices (SPDs), trip units, active filters, lighting, IT equipment, motors, and/or transformers, which are some examples of loads 111, 112, 113, 114, 115, and the IEDs 121, 122, 123, 124, and may detect ground faults, voltage sags, voltage swells, momentary interruptions and oscillatory transients, as well as fan failure, temperature, arcing faults, phase-to-phase faults, shorted windings, blown fuses, and harmonic distortions, which are some example parameters that may be associated with the loads 111, 112, 113, 114, 115. The IEDs 121, 122, 123, 124 may also monitor devices, such as generators, including input/outputs (I/Os), protective relays, battery chargers, and sensors (for example, water, air, gas, steam, levels, accelerometers, flow rates, pressures, and so forth).

According to another aspect, the IEDs 121, 122, 123, 124 may detect overvoltage, undervoltage, or transient overvoltage conditions, as well as other parameters such as temperature, including ambient temperature. According to a further aspect, the IEDs 121, 122, 123, 124 may provide indications of monitored parameters and detected conditions that can be used to control the loads 111, 112, 113, 114, 115 and other equipment in the electrical system in which the loads 111, 112, 113, 114 and IEDs 121, 122, 123, 124 are installed. A wide variety of other monitoring and/or control functions can be performed by the IEDs 121, 122, 123, 124, and the aspects and embodiments disclosed herein are not limited to IEDs 121, 122, 123, 124 operating according to the above-mentioned examples.

It is understood that the IEDs 121, 122, 123, 124 may take various forms and may each have an associated complexity (or set of functional capabilities and/or features). For example, IED 121 may correspond to a "basic" IED, IED 122 may correspond to an "intermediate" IED, and IED 123 may correspond to an "advanced" IED. In such embodiments, intermediate IED 122 may have more functionality (e.g., energy measurement features and/or capabilities) than basic IED 121, and advanced IED 123 may have more functionality and/or features than intermediate IED 122. For example, in embodiments IED 121 (e.g., an IED with basic capabilities and/or features) may be capable of monitoring instantaneous voltage, current energy, demand, power factor, averages values, maximum values, instantaneous power, and/or long-duration rms variations, and IED 123 (e.g., an IED with advanced capabilities) may be capable of monitoring additional parameters such as voltage transients, voltage fluctuations, frequency slew rates, harmonic power flows, and discrete harmonic components, all at higher sample rates, etc. It is understood that this example is for illustrative purposes only, and likewise in some embodiments an IED with basic capabilities may be capable of monitoring one or more of the above energy measurement parameters that are indicated as being associated with an IED with advanced capabilities. It is also understood that in some embodiments the IEDs 121, 122, 123, 124 each have independent functionality.

In the example embodiment shown, the IEDs 121, 122, 123, 124 are communicatively coupled to a central processing unit 140 via the "cloud" 150. In some embodiments, the IEDs 121, 122, 123, 124 may be directly communicatively coupled to the cloud 150, as IED 121 is in the illustrated embodiment. In other embodiments, the IEDs 121, 122, 123, 124 may be indirectly communicatively coupled to the cloud 150, for example, through an intermediate device, such as a cloud-connected hub 130 (or a gateway), as IEDs 122, 123, 124 are in the illustrated embodiment. The cloud-connected hub 130 (or the gateway) may, for example, provide the IEDs 122, 123, 124 with access to the cloud 150 and the central processing unit 140. It is understood that not all IED's have a connection with (or are capable of connecting with) the cloud 150 (directly or non-directly). In embodiments is which an IED is not connected with the cloud 150, the IED may be communicating with a gateway, edge software or possibly no other devices (e.g., in embodiments in which the IED is processing data locally).

As used herein, the terms "cloud" and "cloud computing" are intended to refer to computing resources connected to the Internet or otherwise accessible to IEDs 121, 122, 123, 124 via a communication network, which may be a wired or wireless network, or a combination of both. The computing resources comprising the cloud 150 may be centralized in a single location, distributed throughout multiple locations, or a combination of both. A cloud computing system may divide computing tasks amongst multiple racks, blades, processors, cores, controllers, nodes or other computational units in accordance with a particular cloud system architecture or programming. Similarly, a cloud computing system may store instructions and computational information in a centralized memory or storage, or may distribute such information amongst multiple storage or memory components. The cloud system may store multiple copies of instructions and computational information in redundant storage units, such as a RAID array.

The central processing unit 140 may be an example of a cloud computing system, or cloud-connected computing system. In embodiments, the central processing unit 140 may be a server located within buildings in which the loads 111, 112, 113, 114, 115, and the IEDs 121, 122, 123, 124 are installed, or may be remotely-located cloud-based service. The central processing unit 140 may include computing functional components similar to those of the IEDs 121, 122, 123, 124 is some embodiments, but may generally possess greater numbers and/or more powerful versions of components involved in data processing, such as processors, memory, storage, interconnection mechanisms, etc. The central processing unit 140 can be configured to implement a variety of analysis techniques to identify patterns in received measurement data from the IEDs 121, 122, 123, 124, as discussed further below. The various analysis techniques discussed herein further involve the execution of one or more software functions, algorithms, instructions, applications, and parameters, which are stored on one or more sources of memory communicatively coupled to the central processing unit 140. In certain embodiments, the terms "function", "algorithm", "instruction", "application", or "parameter" may also refer to a hierarchy of functions, algorithms, instructions, applications, or parameters, respectively, operating in parallel and/or tandem. A hierarchy may comprise a tree-based hierarchy, such a binary tree, a tree having one or more child nodes descending from each parent node, or combinations thereof, wherein each node represents a specific function, algorithm, instruction, application, or parameter.

In embodiments, since the central processing unit 140 is connected to the cloud 150, it may access additional cloud-connected devices or databases 160 via the cloud 150. For example, the central processing unit 140 may access the Internet and receive information such as weather data, utility pricing data, or other data that may be useful in analyzing the measurement data received from the IEDs 121, 122, 123, 124. In embodiments, the cloud-connected devices or databases 160 may correspond to a device or database associated with one or more external data sources. Additionally, in embodiments, the cloud-connected devices or databases 160 may correspond to a user device from which a user may provide user input data. A user may view information about the IEDs 121, 122, 123, 124 (e.g., IED manufacturers, models, types, etc.) and data collected by the IEDs 121, 122, 123, 124 (e.g., energy usage statistics) using the user device. Additionally, in embodiments the user may configure the IEDs 121, 122, 123, 124 using the user device.

In embodiments, by leveraging the cloud-connectivity and enhanced computing resources of the central processing unit 140 relative to the IEDs 121, 122, 123, 124, sophisticated analysis can be performed on data retrieved from one or more IEDs 121, 122, 123, 124, as well as on the additional sources of data discussed above, when appropriate. This analysis can be used to dynamically control one or more parameters, processes, conditions or equipment (e.g., loads) associated with the electrical system.

In embodiments, the parameters, processes, conditions or equipment are dynamically controlled by a control system associated with the electrical system. In embodiments, the control system may correspond to or include one or more of the IEDs 121, 122, 123, 124 in the electrical system, central processing unit 140 and/or other devices within or external to the electrical system.

Figure 2:
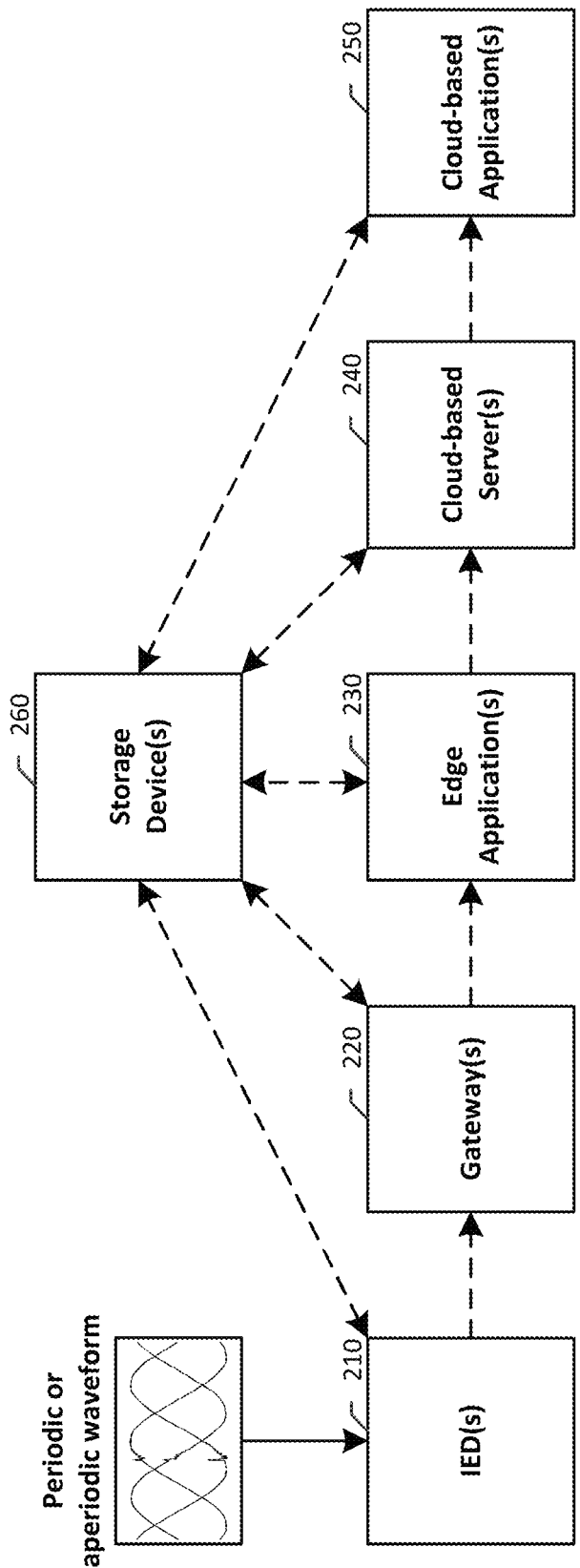
FIG. 2 illustrates examples of where data could be processed for compression in accordance with embodiments of the disclosure.
Figure 2A:
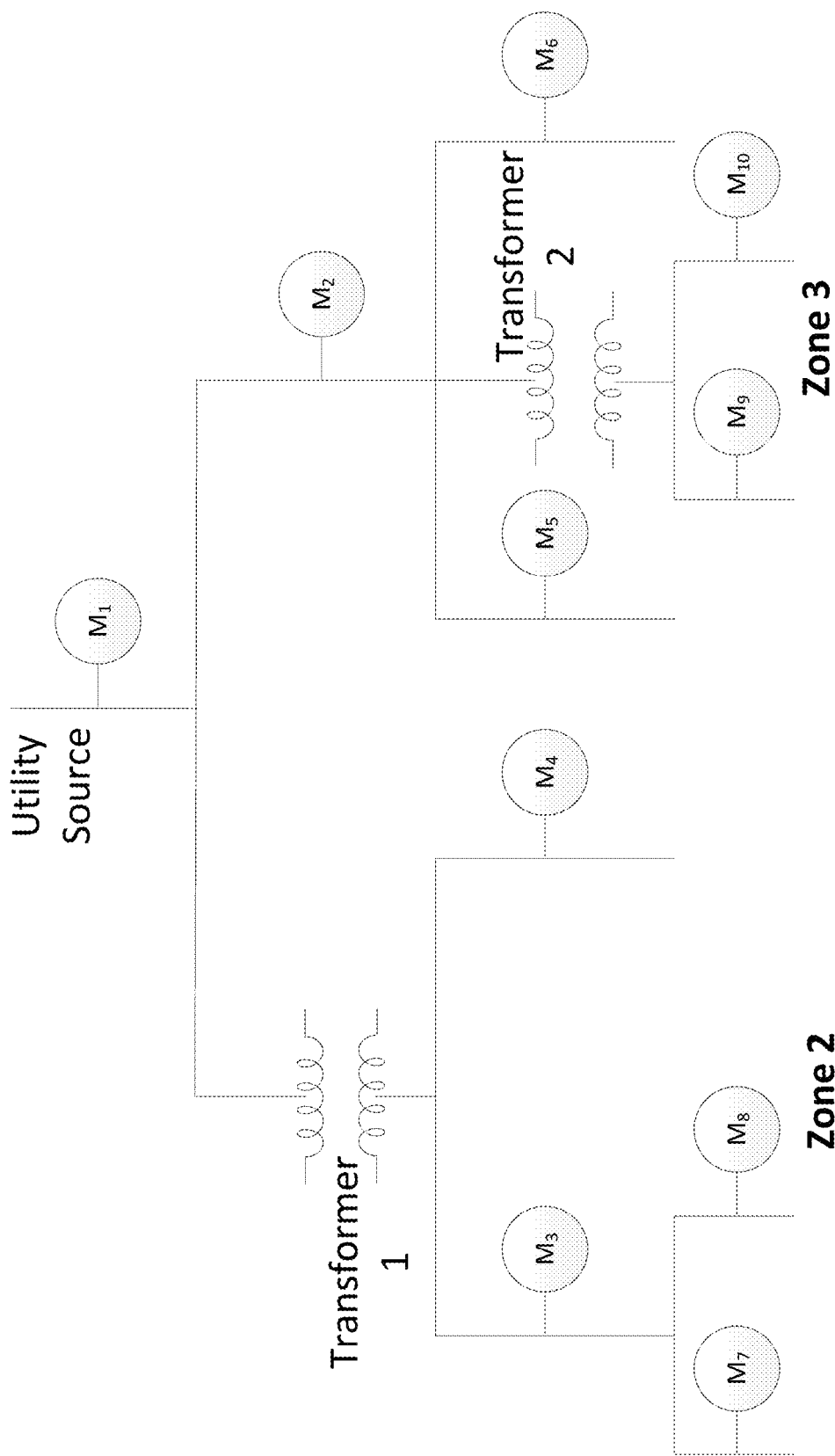
FIG. 2A shows an example electrical power monitoring system (EPMS) in accordance with embodiments of this disclosure.

Referring to FIGS. 2 and 2A, FIG. 2 illustrates examples of where data could be processed for compression in accordance with embodiments of the disclosure. Additionally, FIG. 2A shows an example electrical power monitoring system (EPMS) in accordance with embodiments of this disclosure, for example, for capturing, analyzing and compressing data (e.g., energy-related waveforms).

Referring to FIGS. 2 and 2A, FIG. 2 illustrates examples of where data could be processed for compression in accordance with embodiments of the disclosure. Additionally, FIG. 2A shows an example electrical power monitoring system (EPMS) in accordance with embodiments of this disclosure, for example, for capturing, analyzing and compressing data (e.g., energy-related waveforms). As illustrated in FIG. 2A, EPMSs often incorporate a diverse array of IEDs that are installed throughout an electrical system, such as the electrical system shown in FIG. 1. These IEDs may have different levels of capabilities and feature sets; some more and some less. For example, energy consumers often install high-end (many/most capabilities) IEDs at the location where electrical energy enters their premises ($M_1$ in FIG. 2A). This is done to acquire the broadest understanding possible of the electrical signals' quality and quantity as received from the source (typically, the utility). Because the budget for metering is usually fixed and the energy consumer often wants to meter as broadly as possible across their electrical system, conventional wisdom stipulates using IEDs with progressively lower capabilities as the installed meter points get closer to the loads, in short, the majority of facilities incorporate many more low/mid-range IEDs than high-end IEDs.

"High-end" metering platforms (and some "mid-range" metering platforms) are more expensive and generally capable of capturing PQ phenomena including high-speed voltage events. "Low-end" metering platforms are less expensive and generally have reduced processor bandwidth, sample rates, memory, and/or other capabilities as compared to high-end IEDs. The emphasis of low-end IEDs, including energy measurements taken in most breakers, UPSs, VSDs, etc., is typically energy consumption or other energy-related functions, and perhaps some very basic power quality phenomena (e.g., steady-state quantities such as imbalance, overvoltage, undervoltage, etc.). In short, the EPMS shown in FIG. 2 may include a variety of IEDs and may be configured to monitor one or more aspects of an electrical system.

As noted in the Summary section of this disclosure, and as will be discussed further below, energy-related waveforms captures by IEDs in an electrical system may be analyzed and optimized substantially anywhere, for example, including in at least one IED responsible for capturing the energy-related waveforms. As also noted in the Summary section of this disclosure, and as also will be discussed further below, it is understood that captured energy-related waveforms can be sent as uncompressed waveform capture(s) to the Edge, Gateway, and/or Cloud and be optimized there. For example, as shown in FIG. 2, captured energy-related waveforms can be optimized on at least one IED 210, at least one gateway 220, at least one edge application 230, at least one cloud-based server 240, at least one cloud-based application 250 and/or at least one storage means 260. It is understood that the optimization may occur in one or more additional or alternative systems and devices other than those shown in FIG. 2. For example, while the system illustrated in FIG. 2 is shown as including at least one gateway 220, it is understood that in some instances the system may not include the at least one gateway 220.

It is understood that in accordance with various aspects of this disclosure, the focus of the disclosed invention is on the compression itself; not so much where it occurs.

In accordance with some embodiments of this disclosure, the at least one IED 210 shown in FIG. 2 is configured to capture/generate one or more energy-related waveforms in the electrical system from voltage and/or current signals. For example, the at least one IED 210 may include at least one voltage and/or current measurement device configured to measure the voltage and/or current signals in the electrical system, and the at least one IED 210 may generate one or more energy-related waveform captures (e.g., WFCs, as shown in FIG. 2) from or using the measured voltage and/or current signals.

It is understood that during normal operation of an EPMS, numerous energy-related waveform captures may be captured by multiple devices (e.g., at least one IED 210), producing large amounts of data to be stored (e.g., gigabytes, terabytes, etc.), maintained, retrieved, analyzed, and so forth. It is therefore an object of the invention disclosed herein to decrease the size of energy-related waveform capture files (individually or in groups) without losing important/relevant content/information contained in the energy-related waveform capture(s). In accordance with some embodiments of this disclosure, this reduction is based on the respective use case(s) for the waveform data.

For example, voltage sag events produced by faults exhibit certain characteristics such as a change in the voltage magnitude, a duration of the event, a fault type (Type 1, Type 2, or Type 3), possibly a load impact, superimposed frequency content, and so forth. Similarly, capacitor switching events produce oscillatory transients with some magnitude change, event duration, superimposed frequencies, decay rates, and so forth. There are many additional examples of event waveform captures that can be provided, each with its own unique set of characteristics or traits. It is possible to analyze data associated with a waveform capture (e.g., using an algorithm) to ascertain the broad type or category of an event (e.g., voltage sag, oscillatory transient, etc.). By associating the important characteristics for troubleshooting the cause, locating the source of the issue, determining the event's impact or effect, or any other important consideration with the broad type or category of event, it is possible to filter/remove the inconsequential/less relevant information contained in the waveform capture. Filtering/removing the inconsequential information from waveform captures can reduce the amount of memory required to contain the waveform capture by more than 95% or more in some cases.

For example, as noted in the Background section of this disclosure, a device capturing a set of waveforms from six channels with a length of ten cycles and a sample rate of one thousand twenty four samples/cycles/channels, for example, will result in a file of approximately one hundred twenty kilobytes (KB). In one example implementation of the invention disclosed herein, optimization of the waveform capture may reduce the memory requirement from about one hundred twenty kilobytes (KB) to about six KB (i.e., provide for a data storage reduction of one hundred fourteen KB, which is significant). It should be noted that filtering/removing/averaging data is inherently lossy; however, the full scope of the uncompressed waveform capture is often not required in most applications.

Returning now to FIG. 2, the energy-related waveform captured by the at least one IED 210, which may be periodic and/or aperiodic, may be processed, stored and/or compressed on or using a variety of devices and/or techniques to reduce the size of energy-related waveform capture files without losing important/relevant content/information contained in the energy-related waveform capture(s). For example, as illustrated in FIG. 2, the at least one captured energy-related waveform may be processed, stored and/or compressed on or using one or more of the at least one IED 210, the at least one gateway 220, the at least one edge application 230, the at least one cloud-based server 240, the at least one cloud-based application 250 and the at least one storage means 260. For example, the at least one IED 210 may employ algorithms to "compress at the source." Alternatively, the uncompressed waveform captured by the at least one IED 210 may be passed to a subsequent element (e.g., gateway 220, Edge application 230, Cloud-based application 250, etc.) for compression. The uncompressed waveform capture may be stored as a compressed waveform capture or stored as an uncompressed waveform capture and compressed upon retrieval.

It is understood that the at least one storage means 260 may be located at any point in the system. For example, the at least one storage means 260 may be provided in, or be associated with, at least one of the at least one IED 210, the at least one gateway 220, the at least one edge application 230, the at least one cloud-based server 240, and the at least one cloud-based application 250 in some embodiments. In one example implementation, the uncompressed waveform capture could be compressed and stored in the at least one IED 210, or compressed in the at least one IED 210 and passed to the at least one edge application 230 for storage and so forth. It is understood that the at least one storage means 260 may additionally or alternatively be provided as or correspond to a storage means that is separate from the at least one IED 210, the at least one gateway 220, the at least one edge application 230, the at least one cloud-based server 240, and the at least one cloud-based application 250.

Additional aspects of reducing the size of energy-related waveform capture files without losing important/relevant content/information contained in the energy-related waveform capture(s) will be appreciated from further discussions below.

It is understood that specific applications may use all of the elements, additional elements, different elements, or fewer elements shown in FIG. 2 and other figures to provide the same or similar results. For example, in one example implementation an EPMS in accordance with embodiments of this disclosure may not employ a gateway (e.g., 220) and/or cloud-based connection (e.g., to cloud-based server(s) and/or cloud-based application(s) such as 240, 250). Instead, the EPMS may choose to interconnect at least one IED (e.g., 210) with an Edge application (e.g., 240) via an Ethernet Modbus/TCP interconnection, for example. Moreover, it is understood that different compression techniques may be used at different elements in the system (e.g., the IED(s), the gateway(s), etc.). For example, a first element in the system (e.g., IED(s)) may employ at least one first compression technique and a second element in the system (e.g., gateway(s)) may employ at least one second compression technique. The at least one first compression technique may include one or more same or similar compression techniques as the at least one second compression technique in some embodiments. Additionally, the at least one first compression technique may include one or more different compression techniques from the at least one second compression technique in some embodiments.

Figure 3:
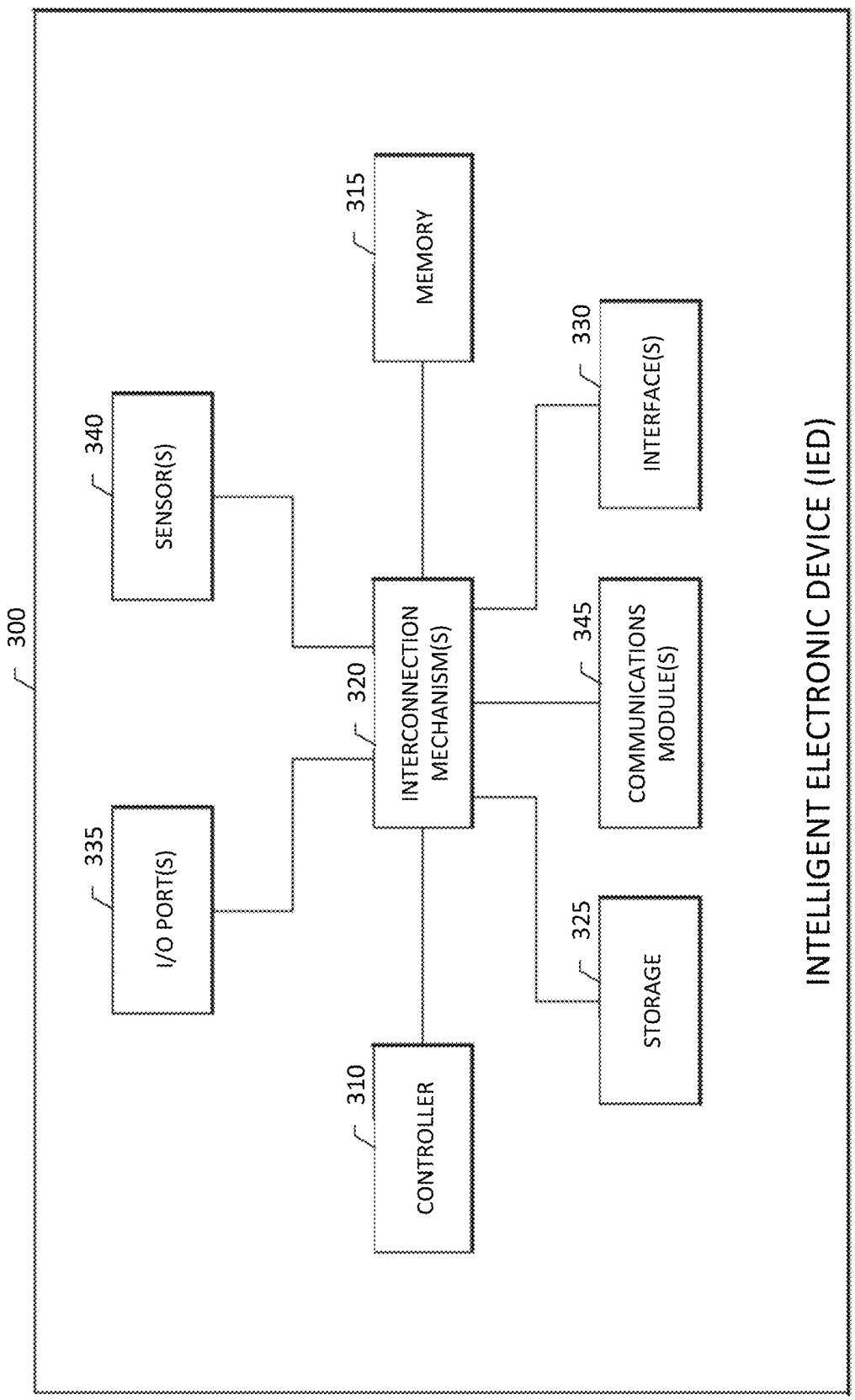
FIG. 3 shows an example intelligent electronic device (IED) that may be used in an electrical system and an EPMS in accordance with embodiments of the disclosure.

Referring to FIG. 3, an example IED 300 that may be suitable for use in the electrical system shown in FIG. 1, and/or the EPMS shown in FIG. 2, for example, to capture, process, store and/or compress energy-related waveform captures, includes a controller 310, a memory device 315, storage 325, and an interface 330. The IED 300 also includes an input-output (I/O) port 335, a sensor 340, a communication module 345, and an interconnection mechanism 320 for communicatively coupling two or more IED components 310-345.

The memory device 315 may include volatile memory, such as DRAM or SRAM, for example. The memory device 315 may store programs and data collected during operation of the IED 300. For example, in embodiments in which the IED 300 is configured to monitor or measure one or more electrical parameters associated with one or more loads (e.g., 111, shown in FIG. 1) in an electrical system, the memory device 315 may store the monitored electrical parameters.

The storage system 325 may include a computer readable and writeable nonvolatile recording medium, such as a disk or flash memory, in which signals are stored that define a program to be executed by the controller 310 or information to be processed by the program. The controller 310 may control transfer of data between the storage system 325 and the memory device 315 in accordance with known computing and data transfer mechanisms. In embodiments, the electrical parameters monitored or measured by the IED 300 may be stored in the storage system 325.

The I/O port 335 can be used to couple loads (e.g., 111, shown in FIG. 1) to the IED 300, and the sensor 340 can be used to monitor or measure the electrical parameters associated with the loads. The I/O port 335 can also be used to coupled external devices, such as sensor devices (e.g., temperature and/or motion sensor devices) and/or user input devices (e.g., local or remote computing devices) (not shown), to the IED 300. The external devices may be local or remote devices, for example, a gateway (or gateways). The I/O port 335 may further be coupled to one or more user input/output mechanisms, such as buttons, displays, acoustic devices, etc., to provide alerts (e.g., to display a visual alert, such as text and/or a steady or flashing light, or to provide an audio alert, such as a beep or prolonged sound) and/or to allow user interaction with the IED 300.

The communication module 345 may be configured to couple the IED 300 to one or more external communication networks or devices. These networks may be private networks within a building in which the IED 300 is installed, or public networks, such as the Internet. In embodiments, the communication module 345 may also be configured to couple the IED 300 to a cloud-connected hub (e.g., 130, shown in FIG. 1), or to a cloud-connected central processing unit (e.g., 140, shown in FIG. 1), associated with an electrical system including IED 300.

The IED controller 310 may include one or more processors that are configured to perform specified function(s) of the IED 300. The processor(s) can be a commercially available processor, such as the well-known Pentium™, Core™, or Atom™ class processors available from the Intel Corporation. Many other processors are available, including programmable logic controllers. The IED controller 310 can execute an operating system to define a computing platform on which application(s) associated with the IED 300 can run.

In embodiments, the electrical parameters monitored or measured by the IED 300 may be received at an input of the controller 310 as IED input data, and the controller 310 may process the measured electrical parameters to generate IED output data or signals at an output thereof. In embodiments, the IED output data or signals may correspond to an output of the IED 300. The IED output data or signals may be provided at I/O port(s) 335, for example. In embodiments, the IED output data or signals may be received by a cloud-connected central processing unit, for example, for further processing (e.g., to identify, track and analyze power quality events), and/or by equipment (e.g., loads) to which the IED is coupled (e.g., for controlling one or more parameters associated with the equipment, as will be discussed further below). In one example, the IED 300 may include an interface 330 for displaying visualizations indicative of the IED output data or signals and/or for selecting configuration parameters (e.g., waveform capture and/or compression parameters) for the IED 300. The interface 330 may correspond to a graphical user interface (GUI) in embodiments.

Components of the IED 300 may be coupled together by the interconnection mechanism 320, which may include one or more busses, wiring, or other electrical connection apparatus. The interconnection mechanism 320 may enable communications (e.g., data, instructions, etc.) to be exchanged between system components of the IED 300.

It is understood that IED 300 is but one of many potential configurations of IEDs in accordance with various aspects of the disclosure. For example, IEDs in accordance with embodiments of the disclosure may include more (or fewer) components than IED 300. Additionally, in embodiments one or more components of IED 300 may be combined. For example, in embodiments memory 315 and storage 325 may be combined.

It is understood that waveform captures (WFCs), such as may be captured by IED 300, for example, are high-speed measurements and recordings of voltage and/or current signals that can be triggered using many methods including: manually, automatically after exceeding one or more parameter threshold(s), periodically (e.g., at 12:00 pm daily), initiated by an external input (e.g., change in digital status input signal), or by some other means. The invention disclosed herein, as will be appreciated from further discussions below, automatically optimizes waveform captures from electrical systems to reduce the size of event waveform capture files without losing important/relevant content/information contained in the energy-related waveform capture(s).

Figure 4:
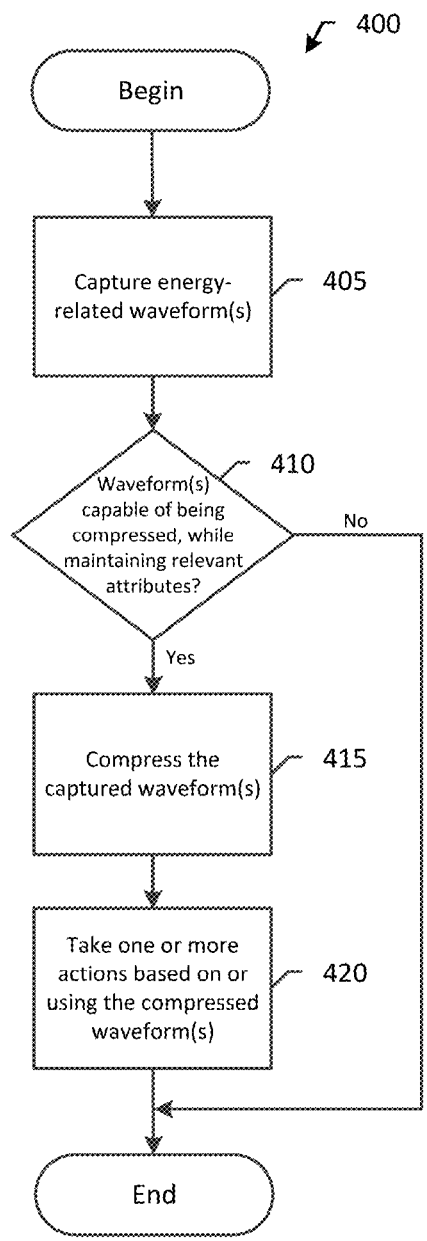
FIG. 4 is a flowchart illustrating an example implementation of a method to automatically optimize waveform captures.
Figure 5:
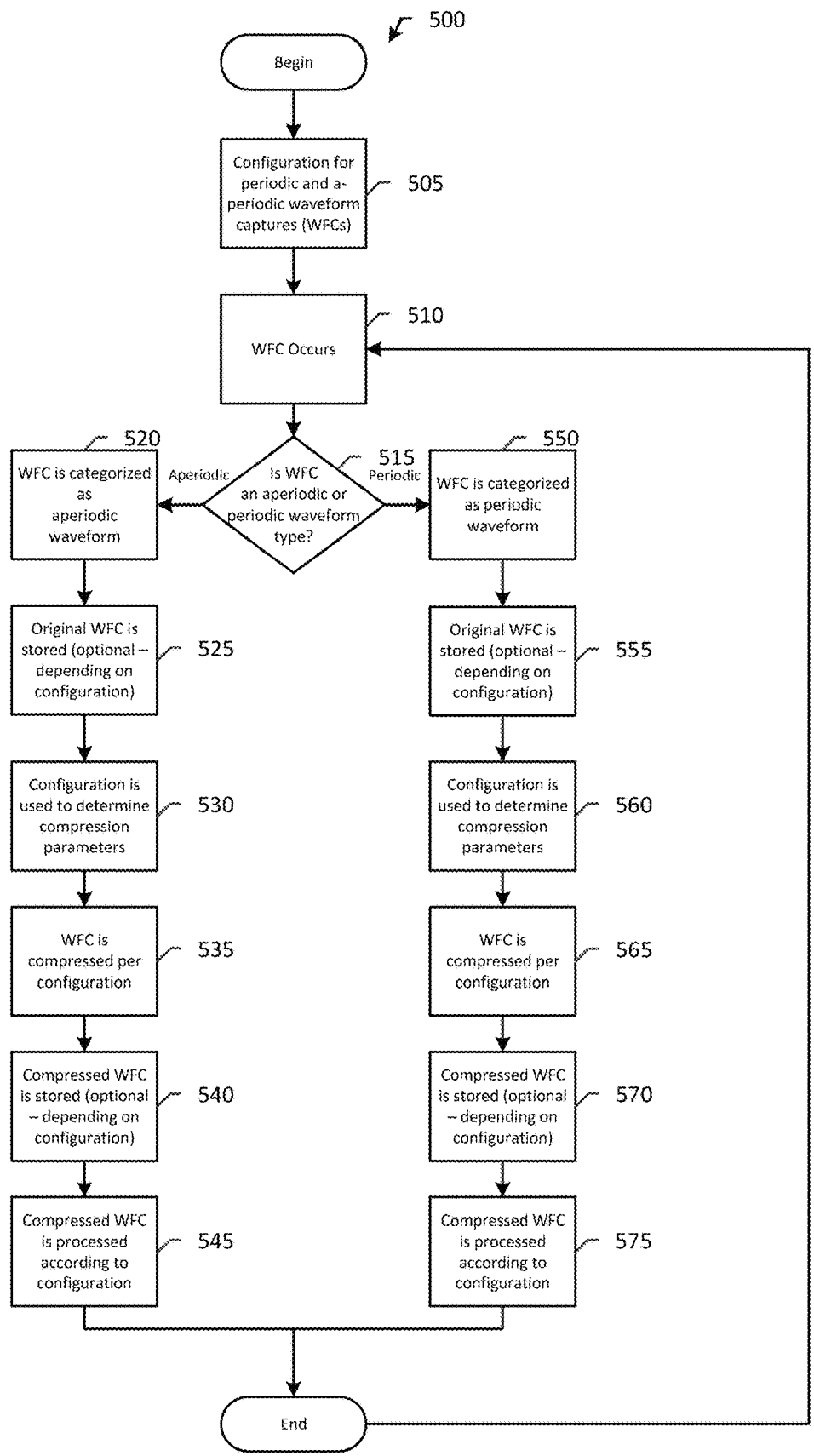
FIG. 5 is a flowchart illustrating another example implementation of a method to automatically optimize waveform captures.

Referring to FIGS. 4 and 5, several flowcharts (or flow diagrams) are shown to illustrate various methods (here, methods 400, 500) of the disclosure relating to automatically optimizing waveform captures from electrical systems, for example, to optimize waveform compression and characterization. Rectangular elements (typified by element 405 in FIG. 4), as may be referred to herein as "processing blocks," may represent computer software and/or IED algorithm instructions or groups of instructions. Diamond shaped elements (typified by element 410 in FIG. 4), as may be referred to herein as "decision blocks," represent computer software and/or IED algorithm instructions, or groups of instructions, which affect the execution of the computer software and/or IED algorithm instructions represented by the processing blocks. The processing blocks and decision blocks (and other blocks shown) can represent steps performed by functionally equivalent circuits such as a digital signal processor circuit or an application specific integrated circuit (ASIC).

The flowcharts do not depict the syntax of any particular programming language. Rather, the flowcharts illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied. Thus, unless otherwise stated, the blocks described below are unordered; meaning that, when possible, the blocks can be performed in any convenient or desirable order including that sequential blocks can be performed simultaneously (e.g., run parallel on multiple processors and/or multiple IEDs) and vice versa. Additionally, the order/flow of the blocks may be rearranged/interchanged in some cases as well. It will also be understood that various features from the flowcharts described below may be combined in some embodiments. Thus, unless otherwise stated, features from one of the flowcharts described below may be combined with features of other ones of the flowcharts described below, for example, to capture the various advantages and aspects of systems and methods associated with automatically optimizing waveform captures from electrical systems sought to be protected by this disclosure. It is also understood that various features from the flowcharts described below may be separated in some embodiments. For example, while the flowcharts illustrated in FIGS. 4 and 5 are shown having many blocks, in some embodiments the illustrated method shown by these flowcharts may include fewer blocks or steps.

Referring to FIG. 4, a flowchart illustrates an example method 400 to automatically optimize waveform captures from an electrical system, for example, to preserve memory, reduce communications bandwidth, and decrease processing time, all while ensuring the necessary data/information is available for characterization, analysis and/or other use. Method 400 may be implemented, for example, on a processor of at least one IED (e.g., 121, shown in FIG. 1) in the electrical system and/or remote from the at least one IED, for example, in at least one of: a cloud-based system, on-site/edge software, a gateway, or another head-end system.

As illustrated in FIG. 4, the method 400 begins at block 405, where at least one energy-related waveform is captured/measured using at least one IED in the electrical system. The at least one IED may be installed or located, for example, at a respective metering point of a plurality of metering points in the electrical system. In some embodiments, the at least one IED may be coupled to one or more loads/equipment/apparatuses (e.g., induction motors) in the electrical system, and the energy-related waveform(s) captured by the at least one IED may be associated with the operation of the loads/equipment/apparatuses to which the at least one IED is coupled. The energy-related waveform(s) may include, for example, at least one of: voltage waveform(s), current waveform(s), power waveform(s), derivatives or integrals of a voltage or current, current and/or power waveforms, power factor, current and/or power waveforms, and any (or substantially any) other energy-related waveform information derived from the voltage and/or current signatures. The voltage and/or current waveform(s) may include, for example, single-phase or polyphase voltage and current waveforms.

At block 410, the at least one captured energy-related waveform is analyzed to determine if the at least one captured energy-related waveform is capable of being compressed, while maintaining relevant attributes for characterization, analysis and/or other use. In accordance with some embodiments of this disclosure, the relevant attributes for characterization, analysis and/or other use include characteristics (e.g., most relevant and/or important characteristics) suitable for detecting and characterizing anomalous conditions (e.g., transient events or chronic conditions and other power quality events) in the electrical system. For example, the characteristics suitable for detecting anomalous conditions may include at least one of: magnitude, duration, frequency components, sag type, phase angle(s) and other relevant information associated with the at least one captured waveform from at least one energy-related signal. It is understood that the relevant attributes for characterization, analysis and/or other use may take a variety of forms and vary, for example, based on the particular characterization(s), analysis(es) and/or other use(s) of interest (e.g., to a system user). In accordance with some embodiments of this disclosure, these particular characterization(s), analysis(es) and/or other use(s) of interest may correspond to or include user-selected characterization(s), analysis(es) and/or other use(s).

Returning now to block 410, if it is determined the at least one captured energy-related waveform is capable of being compressed, while maintaining relevant attributes for characterization, analysis, and/or use, the method may proceed to block 415. For example, in embodiments in which 10 cycles of a single-phase pure 60-Hertz signal are captured at 128 samples/cycle, instead of using every bit of the information from the waveform capture (e.g., 10×128=1,280 measured data points to create all 10 cycles of the original/ uncompressed signal), 128 points of data can be simply be used and indicated it repeats 10 times. Alternatively, the waveform characteristics can be put as 10 cycle of 128 data points with only a 60-Hertz frequency component. The result in either case is a much lower memory requirement than saving a file with all 1,280 discretely measured data points from the uncompressed waveform capture.

Alternatively, if it is determined the at least one captured energy-related waveform is not capable of being compressed, while maintaining relevant attributes for characterization, analysis, and/or use, the method may end, return to block 405 (e.g., for capturing additional energy-related waveform(s) for analysis), or one or more actions may be taken. Example actions may include storing, displaying and/or analyzing the at least one captured energy-related waveform. Additional example actions may be appreciated from further discussions below.

At block 415, the at least one captured energy-related waveform is compressed using at least one compression technique to generate at least one compressed energy-related waveform. More details about the compression, including the at least compression technique selected, are discussed further in connection with figures below. However, let it suffice here to say that in some embodiments compressing the at least one captured energy-related waveform includes downsampling, resampling, reproducing, rebuilding, redeveloping, and/or reconstituting the at least one compressed energy-related waveform from the at least one captured energy-related waveform.

At block 420, one or more actions may be taken or performed based on or using the at least one compressed energy-related waveform. For example, in accordance with some embodiments of this disclosure, the one or more actions may include at least one of: storing the at least one compressed waveform, displaying the at least one compressed waveform, analyzing the at least one compressed waveform, and performing actions based on or in response to the analyzing of the at least one compressed waveform. In accordance with some embodiments of this disclosure, the one or more actions may be initiated automatically, semi-automatically and/or in response to user input (i.e., be user-initiated action(s)). Additional aspects of the one or more actions, and how the one or more actions are selected/ initiated, may be further appreciated from discussions below.

Subsequent to block 420, the method may end in some embodiments. In other embodiments, the method may return to block 405 and repeat again (e.g., for capturing additional energy-related waveforms). In some embodiments in which the method ends after block 420, the method may be initiated again in response to user input, automatically, periodically, and/or a control signal, for example.

It is understood that method 400 may include one or more additional blocks or steps in some embodiments, as will be apparent to one of ordinary skill in the art. For example, in accordance with some embodiments of this disclosure, prior to compressing the at least one captured energy-related waveform (e.g., at block 415), it may be determined if it is beneficial to compress the at least one captured energy-related waveform. In one example implementation, the determination of whether it is beneficial or not beneficial to compress the at least one captured energy-related waveform is based on load type(s), load mix, process(es), application(s), customer type(s), etc. In response to determining it is beneficial to compress the at least one captured energy-related waveform, the at least one captured energy-related waveform may be compressed using the at least one compression technique at block 415, for example. Additionally, in response to determining it is not beneficial to compress the at least one captured energy-related waveform, the at least one captured energy-related waveform may not be compressed (and the method may end or return to block 405, for example).

In some embodiments, one or more actions may be taken or performed based on or using the at least one captured energy-related waveform. For example, the at least one captured energy-related waveform may be stored, displayed, and/or analyzed. In some embodiments, one or more actions may be taken or performed based on or in response to the analysis of the at least one captured energy-related waveform, for example, as will be appreciated from further discussions below.

It is understood that it may be useful to compress a waveform for a single use and discard it while keeping the uncompressed waveform capture (i.e., the at least one captured energy-related waveform). For example, for a motor diagnostics application in which frequency information may be missing from the compressed waveform, and this information is need for the motor diagnostics application, it may be useful to discard to compressed waveform and keep the uncompressed waveform capture. It may also be desirable to keep an uncompressed waveform in cold storage in the cloud and a compressed waveform in hot storage in the cloud. This is again a way to transfer the "essentials" of the uncompressed waveform capture while minimizing memory requirements, communications bandwidth, etc.

Other example aspects of this invention are described below in connection with method 500, for example.

Referring to FIG. 5, a flowchart illustrates an example method 500 for configuring, analyzing and compressing waveform captures. In accordance with some embodiments of this disclosure, method 500 illustrates example steps that may be performed in one or more blocks of method 400 discussed above. Similar to method 400, method 500 may be implemented, for example, on a processor of at least one IED (e.g., 121, shown in FIG. 1) and/or remote from the at least IED, for example, in at least one of: a cloud-based system, on-site software/edge, a gateway, or another head-end system.

As illustrated in FIG. 5, the method 500 begins at block 505, where one or more IEDs in the electrical system are configured to take or perform waveform captures. For example, the one or more IEDs may be configured to take or perform periodic and/or aperiodic waveform captures. In accordance with some embodiments of this disclosure, waveform captures are grouped into one of two categories: "aperiodic" and "periodic" waveform captures. Aperiodic waveform captures come from at least one of a random, arbitrary, unplanned, unexpected, unintentional, or unpredicted event (e.g., voltage sag, voltage swell, voltage transient, and even voltage interruption), often using determined or pre-determined thresholds to trigger the capture, of voltage and/or current signal(s). They may also be triggered by external inputs such as I/O status changes, crossing the thresholds of one or more external sensors, or by some other arbitrary or pseudo-arbitrary condition. Periodic waveform captures come from at least one of a non-random, non-arbitrary, planned, expected, timed, intentional, or predicable actions to request, induce, generate or force a steady-state waveform capture of the voltage and/or current signal(s).

In accordance with some embodiments of this disclosure, various aspects, features and/or parameters relating to the waveform captures (e.g., periodic and/or aperiodic waveform captures), including what is to be done with the waveform captures, may be configured at block 505. For example, with respect to compressing the waveform captures, it is understood that each type of waveform capture (i.e., aperiodic and periodic) may have different compression requirements because they may ultimately be used for distinctive/unique purposes. For example, aperiodic waveforms are often used for troubleshooting events with unknown causes, so compressing the waveform may require more waveform information be preserved since the relevant/important content/information for the event may be unknown prior to analysis. Periodic events may be easier to compress because the purpose of taking a waveform capture is intentional, thus, the relevant/important content/information to preserve in the waveform capture is likely also known. At times it may make sense to use and reference information captured in a periodic waveform to achieve better compression in one or more aperiodic waveform captures from the same IED(s) or system.

In accordance with some embodiments of this disclosure, configuration of the waveform captures may determine the extent of the waveform compression. Configuration may be manual or automatic. Manual may require the end-user to configure output parameters for the compressed waveform. For example, some of these parameters may include (but not limited to):
- the number of waveform cycles,
- number of additional harmonic/interharmonic frequencies considered,
- which additional harmonic/interharmonic frequencies to be considered,
- number of phases to output,
- outputting all three voltages and/or currents or one voltage and/or current (or some combination),
- thresholds for undervoltage/overvoltage/waveform distortion/imbalance to be considered,
- memory compression goals
  - memory reduction,
  - processing time,
  - storage size,
  - retrieval speed,
  - reduction through similarity of repetitious events,
  - by event type(s),
  - by cloud cost,
  - etc.
- number of waveforms to be stored, etc.

Automatic waveform compression may be performed using various methods. For example, based on:
- customer context
  - segment type,
  - load type,
  - process type,
- meter context
  - meter type/capabilities
  - number of meters
  - location of meters
  - unmetered (virtual meter) considerations
  - load/system being monitored
- memory compression goals
  - memory reduction,
  - processing time,
  - storage size,
  - retrieval speed,
  - reduction through similarity of repetitious events,
  - by event type(s),
  - by cloud cost,
  - allowable error from uncompressed waveform,
  - etc.
- number of waveforms to be stored, etc.
- compression to be used
- Event type
  - Aperiodic
    - Voltage sag/swell
    - Transient
    - Special cases
      - E.g., Frequency variations
    - Etc.
  - Periodic
    - Harmonic distortion
    - Imbalance
    - Over/undervoltage
    - Special cases
      - E.g., Voltage fluctuations
    - Etc.

Methods to perform/consider for electrical event waveform compression may include:
- Magnitude as priority (original method described in claims),
- Frequency components as priority (DFT/FFT of event to reproduce . . . generally used with steady-state events),
- Frequency and growth/decay constants as priority (Laplace Transform or Z-transform . . . generally used for aperiodic events which have decaying amplitudes)
- Matrix Decompositions (Singular-Value decomposition, Eigen decomposition, etc.)
- Pattern matching or Distance based (Wavelets, Dynamic Time warping, Shaplets, etc.)
- Neural Network Autoencoders
- Magnitude and frequency both as priority,
- Phase shift considerations (between at least two different signals),
- Signal phase angle considerations (all frequencies embedded in an RMS signal), Phase jump of a signal (generally during an aperiodic event such as a fault), Analyzing a single cycle of a periodic event and reproducing it over multiple cycles (stretching the waveform), Providing statistical metrics on the potential loss through compression (subtracting compressed signal from uncompressed signal)

. . . or any combination thereof.

It is understood that in some instances waveform captures may be captured using multitude of IEDs and representative example waveform capture(s) may be selected from the multitude to retain (while compressing or potentially eliminating the others). This will meet the same goals as the list of benefits above.

Figure 6:
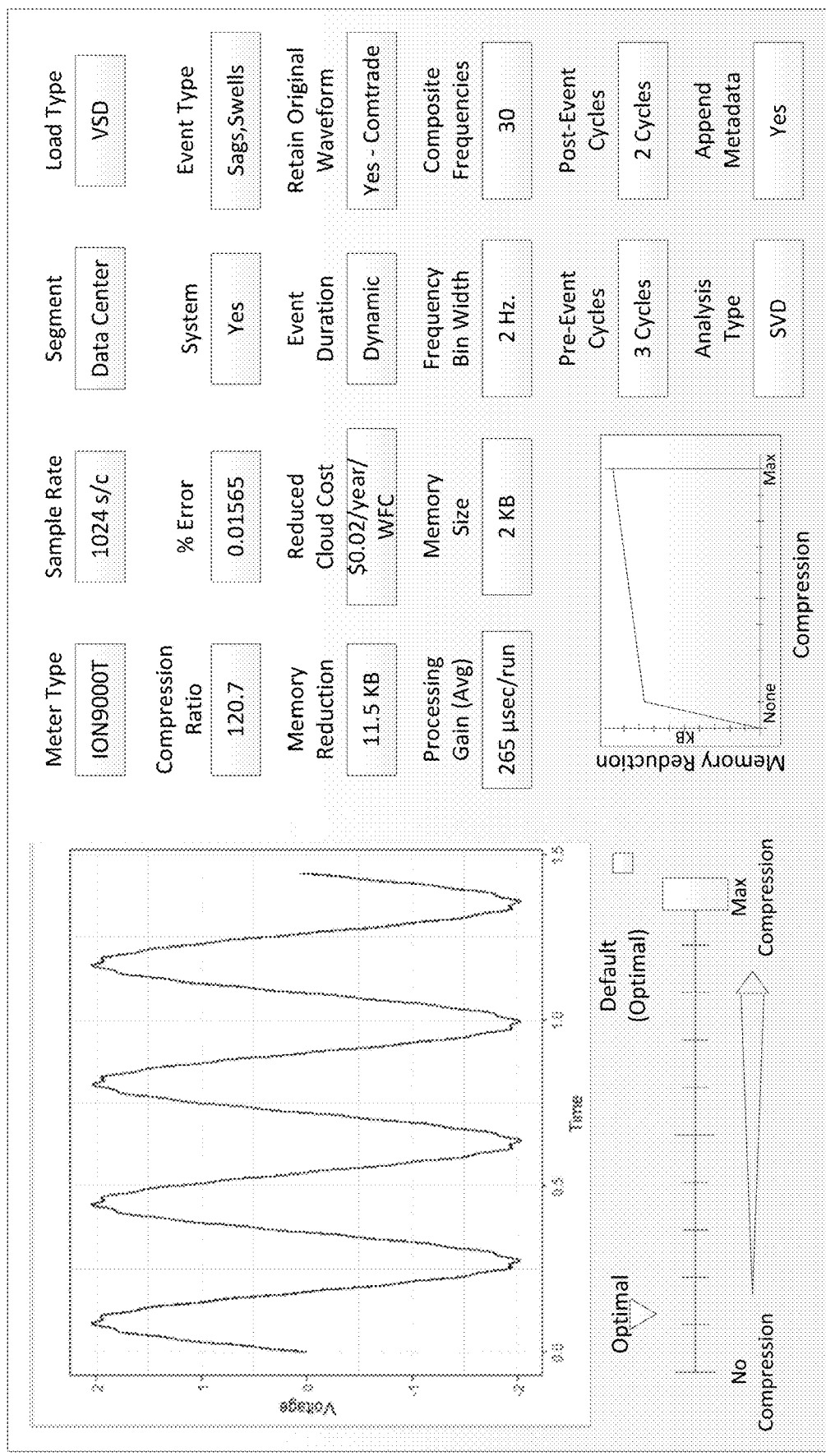
FIG. 6 shows an example interface for configuring waveform captures in accordance with embodiments of this disclosure.
Figure 7:
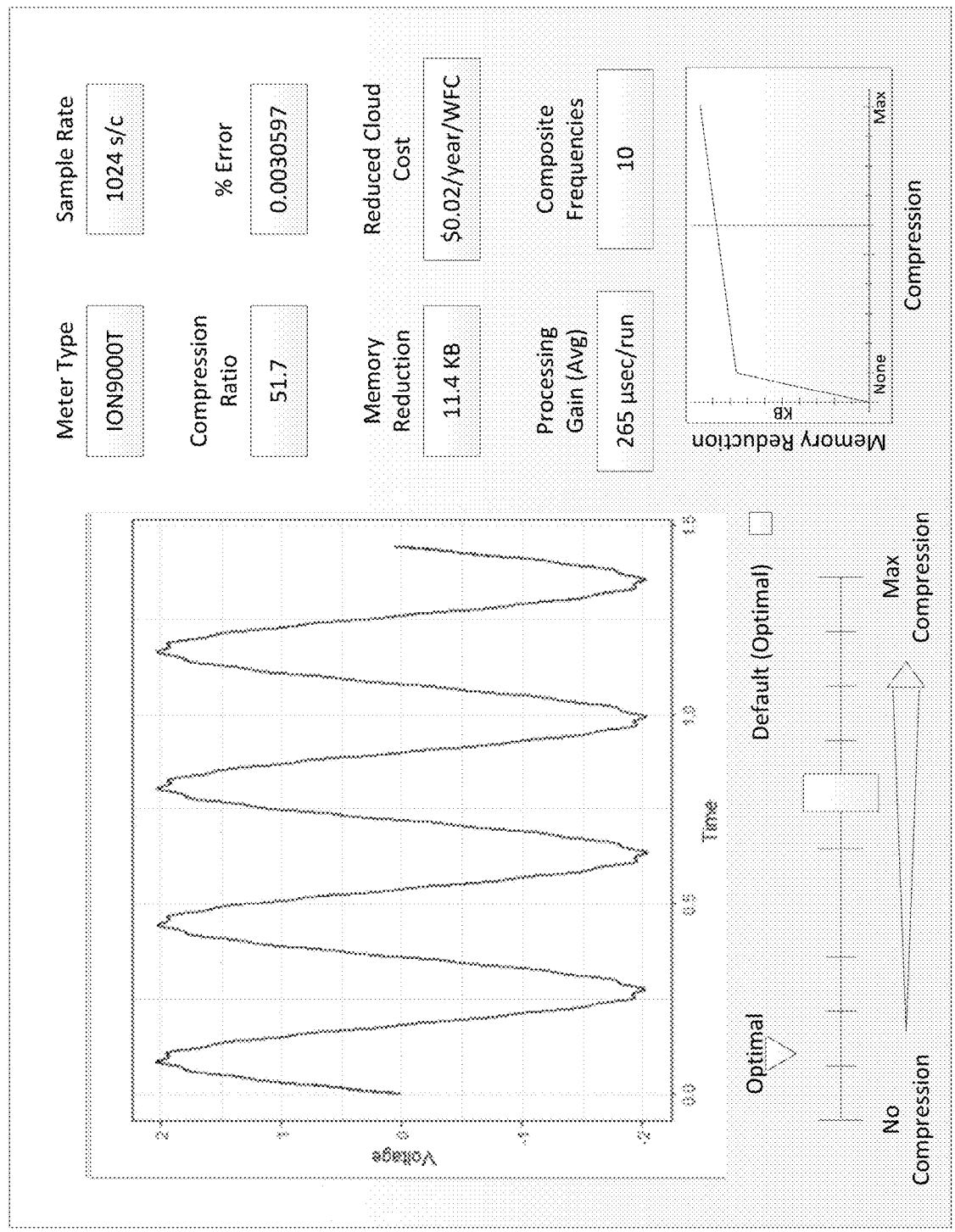
FIG. 7 shows another example interface for configuring waveform captures in accordance with embodiments of this disclosure.
Figure 8:
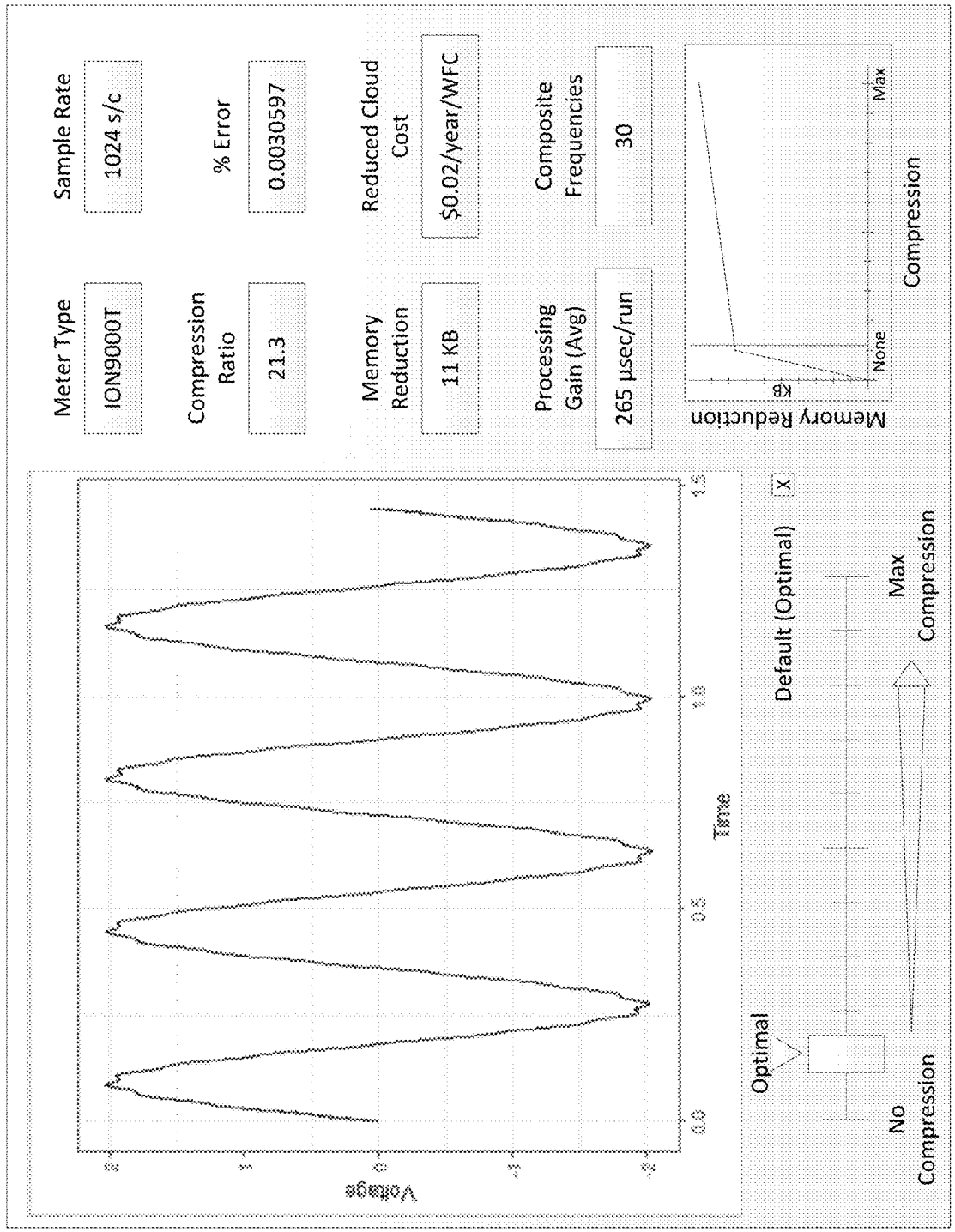
FIG. 8 shows a further example interface for configuring waveform captures in accordance with embodiments of this disclosure.

It is understood that the waveform capture configuration parameters may be selected in an interface (e.g., user interface) in accordance with some embodiments of this disclosure. For example, referring to FIGS. 6-9, before returning to the discussion of method 500 shown in FIG. 5, shown are example interfaces in accordance with embodiments of this disclosure that may enable the configuration of a waveform capture compression feature. The interfaces may correspond to an interface of a user device, an IED, software application, cloud-based application, etc. As illustrated in FIGS. 6-9, the interfaces may take a variety of forms and allow for manual, automatic and/or pseudo-automatic configuration of various parameters and features associated with compressing waveform captures. For example, as shown in FIG. 6, which is illustrative of an example "advanced" configuration interface, a multitude of parameters and features may be automatically and/or manually determined or selected. With respect to configuration of waveform compression, in one example implementation configuration may be performed by using a slider bar to allow the user to dynamically compare and adjust an uncompressed waveform capture against a compressed waveform capture. For example, as illustrated in FIGS. 6-8, sliding the bar right or left changes the amount of compression in the compressed waveform capture to allow the end-user to determine the amount of waveform capture compression by visual assessment. There may be optional metrics provided with this configuration including the amount of error, % memory saved, absolute memory saved (e.g., approximate kilobytes saved), etc. This dynamic comparison may be made, for example, by adjusting any configuration parameter mentioned above (e.g., number of cycles, harmonic components, number of phases, retrieval speed, processing time, etc.). In some instances, the default button puts the configuration settings back to the optimal compression (memory savings vs. error).

Provided below are some example descriptions of example parameters and features may be automatically and/or manually determined or selected.

Meter Type—This is configured using a lookup table, drop-down box or manually entered. The "meter type" (via a table) provides relevant nuanced information about the IED (e.g., metering device) such as accuracy, built-in filters, sample rate, other waveform capture constraints, etc.

Sample Rate—The nominal sample rate may be automatically derived from waveform captures, provided in waveform capture files, taken from the configuration information, or manually entered. This information provides the uncompressed waveform capture sample rate for analysis or to append to the compressed waveform capture.

Segment/Segment Type/Customer Type—Some segment types (e.g., Semiconductor Fabrication facilities, Data Centers, etc.) may require high-speed waveform captures. This may be, in part, due to the sensitivities of the processes within those segments or the load types. The feature provides a suggested amount/level of waveform compression (e.g., more compressed or less compressed) based on an expectation of a segment type's needs. The suggested amount/level of compression would, as an example, be taken from a lookup table with said data.

Load Type(s)—Some loads are more susceptible to energy-related issues or may require one or more relevant specific waveform capture traits be retained in the compressed waveform capture. The load type(s) configuration provides the amount/level of compression based on load type(s) and would, as an example, be taken from a lookup table with said data.

Compression Ratio—This is the ratio of the original memory size to the compressed memory size. Configuring this value may adjust/fix other values such as % error, memory reduction, compressed memory size, processing gain, and reduced cloud cost. It may possibly affect the number of pre-event cycle, the number of post-event cycles, composite frequencies and associated frequency bin widths in some cases. The default setting will likely be an 'ideal' compression ratio for the customer. It is unlikely the feature will be able to compress to some arbitrary ratio on-demand.

% Error—This can be implemented through any of a variety of error measurement calculations; for example, the percent error of the compressed waveform capture with regard to the uncompressed waveform capture. Another example could be to use the segment & load type information to determine those frequencies that are most important to the customer and measure the % error in those frequencies rather than on a point-by-point basis in the waveform capture. Configuring this value may adjust/fix other values such as compression ratio, memory reduction, compressed memory size, processing gain, and reduced cloud cost. Customer would likely pick a "less than" value here (i.e., "I'd like less than 2% error").

System—This indicates that two or more waveform captures will be used together, combined together and/or otherwise influenced by each other (or one influencing the other) to determine the compression parameters, important waveform capture parameters, and/or other waveform capture-related considerations related to waveform capture compression. In the system approach, a system event (i.e., multiple IEDs capturing waveform data on at least one event) may result in at least one waveform being chosen as a "reference waveform capture" and kept as uncompressed while the other waveforms are compressed accordingly.

Event Type—It may be useful to configure the waveform capture compression based on a particularly identified event type, such as transients, sags, swells, waveform distortion (including harmonics), voltage/current imbalance, power frequency variations, overvoltage/undervoltage, or any other available event type as determined by the IED, gateway, Edge software, Cloud-based algorithms or other processing locations. The compression techniques may emphasize/focus on any one or more subset of the waveform capture characteristics to determine how any one or more event types are uniquely compressed.

Memory Reduction—This is the amount of memory size to be reduced. For example, if the uncompressed waveform capture is 100 KB and Memory Reduction is 11.5 KB, then the compressed waveform capture will be 88.5 KB. Configuring this value may fix other values such as % Error, compressed memory size, processing gain, reduced cloud cost, and compression ratio. It will likely affect the number of pre-event cycles, the number of post-event cycles, composite frequencies and frequency bin width, and so forth in some cases.

Reduced Cloud Cost—The purpose of configuring this value is to determine/control the storage cost of the waveform capture data. For example, lowering this value reduces the cost of storing the waveform capture data (within some constraints). It may be a relative (%) cost reduction setting, an absolute cost reduction setting, any combination thereof. It may also be determined using any parameter related to cloud (or other) costs associated with storing waveform capture data. Configuring this value may fix other values such as % Error, compressed memory size, processing gain, reduced cloud cost, and compression ratio. It will likely affect the number of pre-event cycles, the number of post-event cycles, composite frequencies and frequency bin width, and so forth in some cases.

Event Duration—Configuring this value allows the waveform capture event to be captured and/or compressed dynamically or for a fixed length/duration (in cycles or time). A dynamic setting allows the length of the uncompressed waveform capture and/or compressed waveform capture to be variable, depending on the event's length. A static setting provides a fixed length of the uncompressed waveform capture and/or compressed waveform capture, regardless of the event's length. For example, if the uncompressed waveform capture is dynamically captured, it will unlikely be necessary to use dynamic compression of the uncompressed waveform capture's length as it would have already been performed in the uncompressed waveform capture. However, dynamically compressing the length of a static uncompressed waveform capture (e.g., 20 cycles) may save considerable memory if the event is several cycles shorter than the uncompressed waveform capture's static length (e.g., a 5-cycle event).

Retain Uncompressed Waveform Capture—This configuration allows the IED to retain the uncompressed waveform capture along with its compressed waveform capture event pair/equivalent. It may be useful if there is a risk waveform capture compression could potentially lose relevant and/or important information in the compression process. The uncompressed waveforms would likely be stored in "cold storage", where file size is not as important. The compressed waveforms could be more easily and quickly searched, and deeper analyses could then be performed on the on the uncompressed waveform captures on a case-by-case basis.

Processing Gain—This is the ratio of the original memory size to the compressed memory size. Configuring this value may fix other values such as % Error, Memory Reduction, Compression Ratio, Compressed Memory Size, and Reduced Cloud Cost. It may possibly affect the number of pre-event cycles, the number of post-event cycles, composite frequencies, frequency bin width, and so forth, in some cases. Configuring using this value may require an understanding of the processing bandwidth and requirements as they relate to the processing of compressed waveform capture data vs. uncompressed waveform capture data.

Memory Size—Configuring this value provides the estimated final size of a compressed waveform capture's memory requirement. If this value is configured to be less than the minimum required memory size for a compressed waveform capture, then the minimum required size to adequately (albeit with a potentially larger % Error) will be used. Configuring this value may fix other values such as % Error, memory reduction, compression ratio, processing gain, and reduced cloud cost. It may possibly affect the number of pre-event cycles, the number of post-event cycles, composite frequencies, frequency bin width, and so forth, in some cases. This may be redundant with the compression ratio box.

Frequency Bin Width—As there may be frequency jitter around one or more specific frequency component in the energy-related signals, it may be necessary to limit the variance considered of said specific frequencies. For example, a 60 Hertz signal will likely vary/range slightly above and slightly below 60 Hertz, so configuring the frequency bin width to 1 Hertz will allow frequencies between 59.5-60.5 Hertz to be kept together (coalesced in a single bin). This parameter will only be relevant if using one or more frequency-based compression technique(s). However, it could be useful to set a minimum resolution if the customer has prior knowledge.

Composite Frequencies—Configuring this value provides the number of discrete frequencies (or frequencies within a single bin) to be considered for waveform capture compression. This will likely only be used for periodic events. For example, a setting of 2 may only keep the first harmonic component and second harmonic component information of the waveform. Similar to Frequency Bin Width, this would only be utilized if using one or more frequency-based compression techniques.

Pre-Event Cycles—This determines the number of pre-event (normal, before the event) cycles to be included in the compressed waveform capture for aperiodic events. It may also be useful for obtaining steady-state system information without performing a separate waveform capture (albeit arbitrary captured). The longer the pre-event cycles are configured to be, the better the resolution of the steady-state system information, whether it be for harmonic or interharmonic information in the compressed waveform capture.

Post-Event Cycles—This determines the number post-event (recovery after the event) cycles to be included in the compressed waveform capture for aperiodic events.

Analysis Type—Configuring this setting determines the type of waveform capture compression technique to be used. For example, Fourier Analysis uses an evaluation of the uncompressed waveform capture's spectral components to compress uncompressed waveform captures. Other techniques may be employed such as SVD (Singular Value Decomposition) or other matrix decomposition techniques, damped exponential techniques (Prony, ESPIRIT, etc.), damped sinusoidal decompositions (Laplace transform, z-transforms, etc.), transformation of the series into compressed latent-space (for example, using an autoencoder), linear mappings, distance or (dis)similarity values, compressed sensing techniques, or other compressed representations of the data. These methods may be paired together or combined with other standard compression techniques (for example file zipping). Any one of these methods (or any others) have their own benefits (from a loss perspective), so it may be useful to run any of these (or other) methods and use the method that optimizes the compression vs. data loss (e.g., a configuration of "ALL", for example). In practice, this will likely be automatically determined as most end-users will not be familiar enough with these techniques to choose from these options.

Append Metadata—Configuring this value will allow additional data to be appended to the compressed and/or uncompressed waveform captures. For example, if an IED provides a waveform capture from a load, this configuration would allow relevant and/or important load and/or event information to be added to the waveform capture such as the load's nameplate information, cause of the event generating the load, operational condition(s) during the waveform capture, and so forth. This would be extremely useful for evaluating events at a later time, reconfiguring the waveform capture compression settings, and/or taking any other actions related to information derived from the waveform capture and/or its metadata. It is understood that in some instances it may be desirable to append information associated with an uncompressed waveform to a compressed waveform. For example, for an uncompressed 100 KB file/waveform compressed to a 10 KB file/waveform, the degree of compression and/or other related information may be appended to the compressed waveform. Additionally, information relating to the data removed from the compressed waveform as a result of the compression may be appended to the compressed waveform. This may be useful for letting an end-user know about the limits/limitations of the compressed waveform are. For example, in a motor diagnostics application where frequency information and/or interharmonic frequencies were removed from the uncompressed waveform in generating the compressed waveform, the systems and methods disclosed herein may inform and/or indicate the analysis constraints of the compressed waveform.

Default (Optimal)—Default (Optimal) is the most efficient setting for each discrete waveform. This setting will configure waveform capture compression to optimize by selecting the lowest concurrent memory requirements with the smallest % Error. The optimal waveform capture compression will generally be located on or close to the elbow of the curve (see graph in bottom center of advanced configuration page). Optimizing (selecting "Default") will adjust/fix other values such as compression ratio, memory reduction, compressed memory size, processing gain, reduced cloud cost, compression ratio, and % Error. It can also influence other values including composite frequencies, frequency bin width, and other parameters not named here. Default may reset the compression, for example.

Other—Many other parameters, attributes, characteristics may be used to determine the amount of compression and/or what is compressed.

Figure 9:
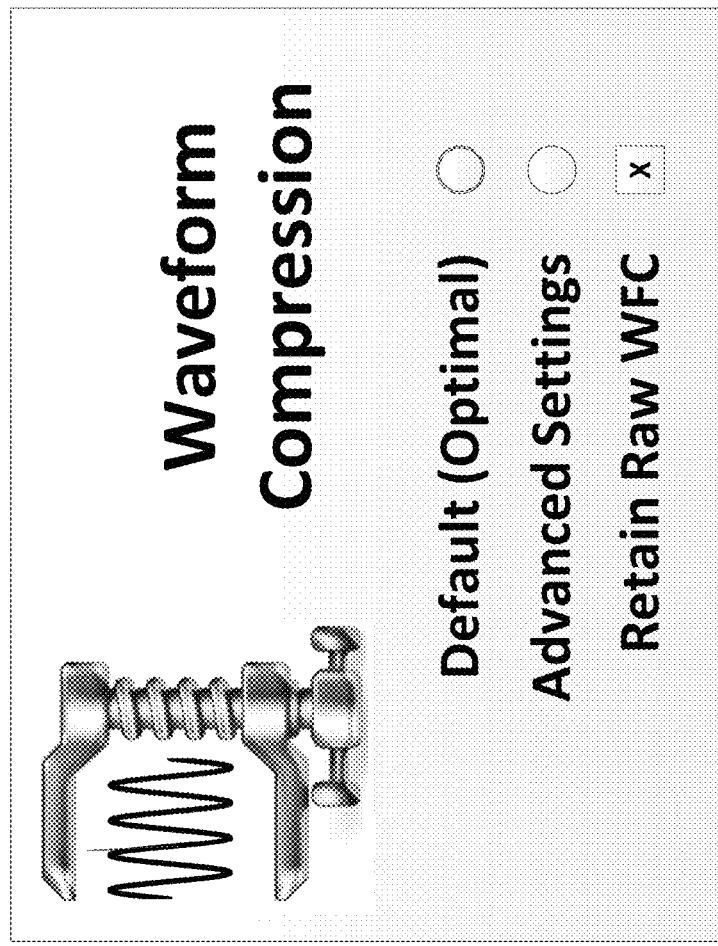
FIG. 9 shows another example interface for configuring waveform captures in accordance with embodiments of this disclosure.

It is understood that the above-listed parameters and features are but a few of many possible parameters and features may be automatically and/or manually determined or selected. It is also appreciated that interfaces in accordance with embodiments of this disclosure may take a variety of forms. For example, as shown in FIGS. 6-8, interfaces in accordance with embodiments of this disclosure may allow for configuration and/or viewing of a multitude of parameters. Additionally, as shown in FIG. 9, interfaces in accordance with embodiments of this disclosure may also be relatively simple, allowing for configuration and/or viewing of a minimal number of parameters.

Returning now to method 500, subsequent to selecting or determining the waveform capture configuration parameters at block 505, the method 500 may proceed to block 510. At block 510, at least one energy-related waveform capture may occur. For example, at least one energy-related waveform may be captured using at least one of the IEDs in the electrical system. The at least one IED may be installed or located, for example, at a respective metering point of a plurality of metering points in the electrical system. The at least one IED may also be a portable IED that an end-user may carry to different areas in a facility.

In accordance with some embodiments of this disclosure, the at least one energy-related waveform capture is initiated automatically, for example, in response to a detected power quality event in the electrical system. For example, the at least one IED may be configured to detect short-term power quality events, such as sags, swells, transients, and instantaneous interruptions at block 505, and the at least one energy-related waveform capture may be initiated in response to at least one IED detecting a possible short-term power quality event. The at least one IED may also be configured to detect other types of power quality event events (e.g., harmonics), and have Disturbance Direction Detection (DDD), which is a capability in some power quality monitoring devices that makes it possible to identify a disturbance's location relative to the meter's location (upstream/downstream). The at least one energy-related waveform capture may be initiated automatically in response to these and other types of events and detection capabilities, for example, as specified at block 505. The at least one energy-related waveform capture may also be initiated semi-automatically and/or in response to user-input (e.g., a manual trigger) in some embodiments, or initiated by exceeding the threshold of some parameter.

At block 515, it is determined whether the at least one captured energy-related waveform is periodic (a signal, with random noise, which is has repeating values after a fixed length of time) or aperiodic (a signal, which may include noise, which does not repeat itself after a fixed interval of time, typically triggered by an electrical perturbation(s) or externally triggered event(s)). In particular, the at least one captured energy-related waveform is analyzed and characterized as a periodic or an aperiodic waveform (or as periodic or aperiodic waveforms). In some instances, the periodic waveform(s) may be triggered manually, by some timer, periodically, by some relevant parameter such as peak active load, typical load, etc., or acquired from a subset of an aperiodic event. However, it is understood that the periodicity of the waveform is not necessarily dependent on its trigger. For example, a periodic trigger (for example, occurring at noon every day) may sometimes capture changes in loads due to standard processes in the building. In this example, the trigger was periodic, but the waveform capture may not be.

In embodiments in which the at least one captured energy-related waveform includes a plurality of waveform conditions, the plurality of waveform conditions may be analyzed and separated into two different groups/types of waveforms, namely periodic or aperiodic waveforms based on the characterization of each of the plurality of waveform conditions.

If it is determined the at least one captured energy-related waveform, or at least one waveform of the at least one captured energy-related waveform, is aperiodic, the method may proceed to block 520. Alternatively, if it is determined the at least one captured energy-related waveform, or at least one waveform of the at least one captured energy-related waveform, is periodic, the method may proceed to block 550. In embodiments in the at least one captured energy-related waveform includes at least one waveform that is aperiodic and at least one waveform that is periodic, the method may proceed to either block 520 or block 550. In some embodiments, block 520 and 550 (and associated blocks) may be performed sequentially or in parallel.

At block 520, the at least one captured waveform is characterized as aperiodic, for example, based on the analysis performed (or information provided by the IED) at block 515. Additionally, at block 525, which is optional in some embodiments, the at least one captured waveform may be stored. In accordance with some embodiments of this disclosure, whether the at least one captured waveform is stored may be automatically determined (e.g., based on customer type, segment, etc.) or manually determined/configured (e.g., in a user interface). For example, a user may specify in a user interface if the user wants to save all, select or no captured (i.e., uncompressed) waveforms. For example, in accordance with some embodiments of this disclosure, it may be desirable to save only compressed waveforms. As described throughout this disclosure, compression using the techniques disclosed herein ensures that captured waveforms, when compressed, maintain relevant attributes for characterization, analysis and/or other use (or the compression does not occur). For this reason, it may not be beneficial for users to save both the captured (i.e., uncompressed) waveforms and compressed waveforms (since the compressed waveforms are sufficient for the user's intended characterization, analysis, purpose, and/or other use).

In other embodiments (e.g., where storage space and costs are not a major consideration), it may be desirable to save both the captured waveforms and compressed waveforms. For example, in some instances it may be desirable to save both the captured waveforms and compressed waveforms when the user's intended characterization, analysis and/or other use may be subject to change over time. For example, compressed waveforms for the user's intended characterization, analysis and/or other use at a first time may not be sufficient for the user's intended characterization, analysis and/or other use at a second, later time in some instances. For this reason, it may be desirable to store both the captured waveforms and compressed waveforms, and be able to generate compressed waveforms from the captured waveforms for the user's intended characterization, analysis and/or other use at any given time. It is understood that the above-provided examples are but a few of many possible example reasons for saving all, select or no captured waveforms. Alternatively, it may be prudent to keep both uncompressed and compressed waveform captures as the compressed waveforms could be more easily and quickly searched, and deeper analyses could then be performed on the on the uncompressed waveform captures on a case-by-case basis.

In accordance with some embodiments of this disclosure, where the at least one captured waveform is stored may also be automatically or manually determined/configured, for example, as discussed above in connection with FIGS. 2 and 2A. For example, where the at least one captured waveform is stored may be automatically determined, for example, based on characteristics of the at least one captured waveform (e.g., size and type of the at least one captured waveform). Additionally, where the at least one captured waveform is stored may be automatically determined based on user input data (e.g., at block 505). For example, a user may specify that captured waveforms below a certain size should be stored in a first location (e.g., on a first data storage device), and captured waveforms above the certain size should be stored in a second, different location (e.g., on a second, different data storage device). A user may also manually specify where the at least one captured waveform is stored. For example, a user may specify that all or certain captured waveforms be stored in a specific location or specific locations (e.g., on one or more particular data storage devices). The user input data/storage preferences may be received/provided in a user interface, such as the user interfaces shown in FIGS. 6-9, for example.

In embodiments in which the at least one captured waveform is stored, it is understood that the at least one captured waveform may be stored locally (e.g., on at least one local storage device) and/or remotely (e.g., on cloud-based storage), for example, based on the above-discussed user-configured preference(s). It is understood that the location(s) in which the at least one captured waveform is/are stored may be based on a variety of other factors including customer segment(s), process(es), memory requirements, cost(s), etc.

In accordance with embodiments of this disclosure, there may be benefits to storing the uncompressed waveform captures from one location and compressing the waveform capture prior to transferring it to another location. For example, uncompressed waveform captures may be stored on the cloud; however, these waveform captures may be compressed before providing them to an external application (e.g., cloud-based application). Similarly, compressed waveform captures may be "typically" used by local or remote application; however, the uncompressed waveform captures can be retrieved should they be required for supplemental analysis. Optionally, the uncompressed waveform captures may be stored on an end-user's premises and their respective compressed waveform captures may be stored on a cloud-based server, and so forth. It is understood that compressed waveform captures are typically much faster to process, search, analyze, etc.

At block 530, configuration information is used to determine compression parameters for compressing the at least one captured waveform. For example, configuration information received from a user (e.g., at block 505) may be used to determine compression parameters for compressing the at least one captured waveform. Compression parameters may also be determined automatically or semi-automatically, as discussed above.

At block 535, the at least one captured waveform is compressed in accordance with the compression parameters. For example, at least one compression technique for compressing the at least one captured waveform may be selected based on or using the compression parameters.

In accordance with some embodiments of this disclosure, compression techniques used for each uncompressed waveform capture may be appended (in some way), for example, to the compressed waveform capture data. This will allow the ability to understand the constraints of the compressed waveform capture during its future analyses. For example, the compression technique may use only the ten largest frequency components to produce a compressed waveform capture. The error associated with this particular compression may be 0.15%. The fact that only ten frequency components were used to produce the compressed waveform capture is deterministic (i.e., through spectral analysis); however, the resulting error from the compression technique is not deterministic. In this case, it may be useful to append the resulting error from the compression technique to the compressed waveform capture. Additionally, it may be useful to append an indication of the specific compression technique(s) used (e.g., Fourier analysis, Prony Method, Singular-Value Decomposition, etc.) to compress the uncompressed waveform capture to the compressed waveform capture. This will provide a person analyzing the compressed waveform capture (or the event associated with the compressed waveform capture) with the inherent constraints associated with the compressed waveform capture being evaluated. Moreover, supplemental information could also be appended to the compressed waveform capture file including at least one of: IED used to capture the event, sample rate of IED, filtering characteristics (e.g., anti-aliasing, etc.), device configuration parameters, customer, metadata, and/or any other characteristic, trait, value and/or relationship associated with internal and/or external factors associated with the uncompressed and/or compressed waveform capture.

In accordance with some embodiments of this disclosure, prior to compressing the at least one captured waveform, it is determined the at least one captured energy-related waveform is capable of being compressed, while maintaining relevant attributes for characterization, analysis, and/or use, for example, as discussed above in connection with method 400 and throughout this disclosure.

At block 540, which is optional in some embodiments, the at least one compressed waveform may be stored in one or more locations/systems/devices. Example considerations relating to storage of the at least one compressed waveform and the at least one captured waveform were discussed, for example, above in connection with block 525 and FIGS. 2 and 2A, and therefore will not be described again with respect to block 540.

At block 545, the at least one compressed waveform is processed according to the configuration. For example, the at least one compressed waveform may be processed to identify particular power quality events (e.g., transient events, short-duration rms variations) in the electrical system according to the configuration. The processing may optionally include and/or leverage data appended to the compressed waveform capture including, in some cases, information associated with techniques used to compress the uncompressed waveform capture.

Returning now to block 515, in embodiments in which the at least one captured waveform, at least one waveform of the at least one captured waveform, is determined to be periodic, the method proceeds to block 550. At block 550, the at least one captured waveform is characterized as periodic, for example, based on the analysis (or information provided by the IED) performed at block 515. Additionally, at block 555, which is optional in some embodiments, the at least one captured waveform may be stored. It is understood that considerations relating to storage of the at least one captured waveform at block 555 may be the same as or similar to the considerations relating to storage of the at least one captured waveform at block 525 discussed above in some embodiments, and different in other embodiments.

At block 560, configuration information is used to determine compression parameters for compressing the at least one captured waveform. It is understood that considerations relating to determining compression parameters for compressing the at least one captured waveform at block 560 may be the same as or similar to the considerations relating to determining compression parameters for compressing the at least one captured waveform at block 530 discussed above in some embodiments, and different in other embodiments.

At block 565, the at least one captured waveform is compressed in accordance with the compression parameters. It is understood that considerations relating to compressing the at least one captured waveform at block 565 may be the same as or similar to the considerations relating to compressing the at least one captured waveform at block 535 discussed above in some embodiments, and different in other embodiments.

At block 570, which is optional in some embodiments, the at least one compressed waveform may be stored. It is understood that considerations relating to storage of the at least one compressed waveform at block 570 may be the same as or similar to the considerations relating to storage of the at least one compressed waveform at block 540 discussed above in some embodiments, and different in other embodiments.

At block 575, the at least one compressed waveform is processed according to the configuration. It is understood that considerations relating to processing the at least one compressed waveform at block 575 may be the same as or similar to the considerations relating to processing the at least one compressed waveform at block 545 discussed above in some embodiments, and different in other embodiments.

Subsequent to block 575, or block 545 in embodiments in which the at least one captured waveform is only aperiodic, the method may end in some embodiments. In other embodiments, the method may return to block 505 and repeat again (e.g., for configuration features associated with waveform captures and/or for capturing additional energy-related waveforms). In some embodiments in which the method ends after block 575 or block 545, the method may be initiated again in response to user input, automatically, and/or a control signal, for example.

It is understood that method 500 may include one or more additional blocks or steps in some embodiments, as will be apparent to one of ordinary skill in the art.

It is also understood that there are other features contemplated relating to the above discussed invention relating to automatically optimizing waveform captures from one or more IEDs in electrical systems. For example, in accordance with some embodiments of this disclosure waveform compression variables may be determined using one or more characteristics from a single uncompressed waveform capture, from one or more characteristics determined from two or more uncompressed waveform captures, or some combination. An example of "some combination" of compression techniques used may be that periodic waveforms use only discrete uncompressed waveform captures to determine how said uncompressed waveform capture will be compressed. However, aperiodic waveforms may use multiple uncompressed waveform captures from multiple IEDs capturing the same event to determine how best to compress this plurality of uncompressed waveform captures associated with the event.

It is understood that a potential benefit of performing waveform capture compression is the inherent characterization, qualification and quantification that occurs to simplify the uncompressed waveform capture data. Characterizing, qualifying and quantifying an uncompressed waveform capture (as described herein) requires a form of pre-analysis of the waveform data, memory compression requirements, application, metadata associated with IED, or some combination thereof to ascertain, describe, and/or select the relevant attributes of the uncompressed waveform capture to produce the optimal waveform capture compression constraints. Regardless of whether or not the uncompressed waveform capture is eventually compressed, the information developed through this pre-analysis is useful to more efficiently analyze the waveform capture (uncompressed or compressed) at some future time. For example, spectral analysis of a waveform capture (uncompressed or compressed) may require significant processing time, depending on the processor's speed, availability, and the volume of waveform captures being analyzed. Appending the results from the original characterization, qualification, and quantification to the waveform capture file may significantly decrease the processing time when analyzing multiples of waveform captures because the results from at least some of the more processor intensive analyses will have already been completed. For example, rather than a requirement to perform spectral analysis on a waveform capture (uncompressed or compress) repeatedly over its life, the relevant data will already be available as appended to the waveform capture file. This can significantly reduce the processing time for waveform capture analytics applications.

Another feature associated with this application is the ability to determine whether it is beneficial to maintain/keep a copy of the uncompressed waveform capture for future use. This may be determined by evaluating measurable attributes associated with the uncompressed waveform capture against its respective compressed waveform capture's attributes. If the discrepancy between the two is significant, then a copy of the uncompressed waveform capture (or perhaps a subset that is greater than the compressed waveform capture's attributes) may optionally be stored internally or externally to the system (see drawing above). This decision may occur based on the ratio of attributes, a fixed or variable threshold, magnitude of error, when the user overrides compression recommendations provided by the system's compression algorithms, or some combination thereof.

It is understood that there are many possible extensions relating to the above discussed invention relating to automatically optimizing waveform captures from one or more IEDs in electrical systems. For example, another related idea is reconstituting a waveform from low-end devices that do not technically generate waveforms. This works best with steady-state signals. For example, a Goertzel algorithm/filter may be used to identify and quantify individual harmonic components. Then the characteristics for the individual frequencies (fundamental+each harmonic quantified (magnitude and phase information) by the Goertzel filter) associated with the energy-related signal(s) may be provided to a head-end system, which the develops/produces/generates a representative waveform that is a reasonable depiction of an energy-related signal(s) encompassing said characteristics. Compression loss metrics may be determined using this approach by summing the squared difference of the reproduced signal from the uncompressed signal (if enough information is available).

The table below describes some of the waveform categories, feature benefits, constraints, considerations, and configurations associated with these ideas.

As described above and as will be appreciated by those of ordinary skill in the art, embodiments of the disclosure herein may be configured as a system, method, or combination thereof. Accordingly, embodiments of the present disclosure may be comprised of various means including hardware, software, firmware or any combination thereof.

It is to be appreciated that the concepts, systems, circuits and techniques sought to be protected herein are not limited to use in the example applications described herein (e.g., power monitoring system applications), but rather may be useful in substantially any application where it is desired to optimize waveform captures from one or more IEDs in an electrical system. While particular embodiments and applications of the present disclosure have been illustrated and described, it is to be understood that embodiments of the disclosure not limited to the precise construction and compositions disclosed herein and that various modifications, changes, and variations can be apparent from the foregoing descriptions without departing from the spirit and scope of the disclosure as defined in the appended claims.

Having described preferred embodiments, which serve to illustrate various concepts, structures and techniques that are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

What is claimed is:

1. A method to automatically optimize waveform captures from an electrical system, comprising:
    capturing at least one energy-related waveform using at least one Intelligent Electronic Device (IED) in the electrical system;
    analyzing the captured at least one energy-related waveform to determine if the at least one captured energy-related waveform is capable of being compressed, while maintaining relevant attributes for characterization, analysis and/or other use;
    in response to determining the at least one captured energy-related waveform is capable of being compressed, while maintaining relevant attributes for characterization, analysis, and/or use, compressing the at least one captured energy-related waveform using at least one compression technique to generate at least one compressed energy-related waveform; and
    taking one or more actions based on or using the at least one compressed energy-related waveform.

2. The method of claim 1, wherein prior to compressing the at least one captured energy-related waveform, it is determined if it is beneficial to compress the at least one captured energy-related waveform, and in response to determining it is beneficial to compress the at least one captured energy-related waveform, the at least one captured energy-related waveform is compressed using the at least one compression technique to generate the at least one compressed energy-related waveform.

3. The method of claim 2, wherein in response to determining it is not beneficial to compress the at least one captured energy-related waveform, the at least one captured energy-related waveform is not compressed.

4. The method of claim 3, wherein one or more actions are taken based on or using the at least one captured energy-related waveform.

5. The method of claim 2, wherein the determination of whether it is beneficial or not beneficial to compress the at least one captured energy-related waveform is based on at least one of: load type(s), load mix, process(es), application(s) and customer type(s).

6. The method of claim 1, wherein compressing the at least one captured energy-related waveform includes:
    at least one of downsampling, resampling, reproducing, rebuilding, and reconstituting the at least one compressed energy-related waveform from the at least one captured energy-related waveform.

7. The method of claim 1, wherein the at least one compression technique is automatically selected to optimize degree or level of compression with amount of error.

8. The method of claim 1, wherein the at least one compression technique is selected based on at least one of one or more user-defined parameters or automatically determined based on configuration of the at least one IED.

9. The method of claim 8, wherein the user-defined parameters include at least one of: desired amount of error, desired degree of compression, desired memory reduction, desired cost savings, desired processing gain, selected composite frequencies, relevant characteristics, important traits, and anomalous conditions of interest to be detected using the at least one compressed energy-related waveform.

10. The method of claim 8, wherein the user-defined parameters are constrained by what is at least one of acceptable, reasonable, possible, practical, and attainable.

11. The method of claim 8, wherein the user-defined parameters are selected on a user interface.

12. The method of claim 8, wherein the user-defined parameters are ranked by the end-user from most important to least important to the end-user, and the at least one compression technique is selected based, at least in part, on this ranking.

13. The method of claim 1, further comprising:
determining if the at least one captured energy-related waveform is periodic or aperiodic, wherein the at least one compression technique is selected based, at least in part, on whether the at least one captured energy-related waveform is periodic or aperiodic.

14. The method of claim 13, further comprising:
in response to determining the at least one captured energy-related waveform is periodic, at least one of downsampling, resampling, reproducing, rebuilding, and reconstituting the at least one compressed energy-related waveform from a subset of the at least one captured energy-related waveform.

15. The method of claim 13, further comprising:
in response to determining the at least one captured energy-related waveform is aperiodic, determining if there are any periodic portions of the aperiodic at least one captured energy-related waveform.

16. The method of claim 15, further comprising:
in response to determining there are periodic portions of the aperiodic at least one captured energy-related waveform, selecting one or more first compression techniques to compress periodic portions of the aperiodic at least one captured energy-related waveform, and selecting one or more second compression techniques to compress aperiodic portions of the aperiodic at least one captured energy-related waveform, the first and second compression techniques corresponding to the at least one compression technique.

17. The method of claim 16, wherein the first and second compressions techniques are the same as or similar to each other.

18. The method of claim 16, wherein the first and second compressions techniques are different from each other.

19. The method of claim 16, wherein prior to selecting the one or more first compression techniques to compress periodic portions of the aperiodic at least one captured energy-related waveform, and selecting the one or more second compression techniques to compress aperiodic portions of the aperiodic at least one captured energy-related waveform, it is determined if it is beneficial or desirable to apply same, similar or different compression techniques to compress the periodic and the aperiodic portions of the aperiodic at least one captured energy-related waveform.

20. The method of claim 19, wherein the determination of whether it is beneficial or desirable to apply same, similar or different compression techniques to compress the periodic and the aperiodic portions of the aperiodic at least one captured energy-related waveform is at least one of event, application and customer specific.

21. The method of claim 1, wherein the one or more actions taken based on or using the at least one compressed energy-related waveform include at least one of: storing the at least one compressed waveform, displaying the at least one compressed waveform, analyzing the at least one compressed waveform, and performing actions based on or in response to the analyzing of the at least one compressed waveform.

22. The method of claim 21, wherein the at least one compressed waveform is stored locally and/or remotely based on a user-configured preference.

23. The method of claim 21, wherein the at least one compressed waveform is stored in at least a first location, and the at least one captured waveform is stored in at least a second location.

24. The method of claim 23, wherein the first and second locations are different locations.

25. The method of claim 23, wherein the first and second locations are same locations.

26. The method of claim 21, wherein the at least one compressed waveform is displayed on a user interface.

27. The method of claim 21, wherein the at least one compressed waveform is presented at least one of alongside, over, and superimposed on the at least one captured waveform to illustrate similarities between the least one compressed waveform and the at least one captured waveform displayed on a user interface.

28. The method of claim 21, wherein the at least one compressed waveform is analyzed to identify and monitor/track anomalous conditions in the electrical system.

29. The method of claim 28, wherein at least one action is performed in response to the identified anomalous conditions, the at least one action including at least one of: identifying cause(s) of the identified anomalous conditions and recommending at least one mitigation technique to address or reduce the identified anomalous conditions.

30. The method of claim 1, wherein the relevant attributes for characterization include characteristics suitable for detecting and characterizing anomalous conditions in the electrical system.

31. The method of claim 30, wherein the characteristics suitable for detecting anomalous conditions include at least one of: magnitude, duration, frequency components, sag type, phase angle, a combination of the magnitude, the duration, the frequency components, the sag type and the phase angle, and other relevant information associated with the at least one captured waveform.

32. The method of claim 1, wherein the at least one captured energy-related waveform(s) includes at least one of: a voltage signal, a current signal, and another signal and/or data derived from the any one the voltage signal and/or the current signal.

33. The method of claim 32, wherein the voltage signal and the current signal are at least one of: a single-phase voltage and current signal, and a polyphase voltage and current signal.

34. The method of claim 1, wherein the at least one captured energy-related waveform is associated with at least one load in the electrical system.

35. The method of claim 1, wherein relevant data relating to spectral analysis on the captured at least one energy-related waveform is available as appended to file(s) associated with the at least one compressed energy-related waveform, thereby significantly reducing processing time for waveform capture analytics applications by preventing a need for a repeated analysis operation in the future.

36. The method of claim 1, further comprising:
in response to determining to not compress the at least one captured energy-related waveform, attaching or appending metadata on analysis performed to: the at least one captured energy-related waveform, data indicative of the at least one captured energy-related waveform, data including the at least one captured energy-related waveform, and/or any pertinent information about the at least one captured energy-related waveform that is useful/interesting to the end-user.

37. A system to automatically optimize waveform captures an electrical system, comprising:
- at least one processor;
- at least one memory device coupled to the at least one processor, the at least one processor and the at least one memory device configured to:
- capture at least one energy-related waveform using at least one Intelligent Electronic Device (IED) in the electrical system;
- analyze the at least one captured energy-related waveform to determine if the at least one captured energy-related waveform is capable of being compressed, while maintaining relevant attributes for characterization, analysis and/or other use;
- in response to determining the at least one captured energy-related waveform is capable of being compressed, while maintaining relevant attributes for characterization, analysis, and/or use, compress the at least one captured energy-related waveform using at least one compression technique to generate at least one compressed energy-related waveform; and
- take one or more actions based on or using the at least one compressed energy-related waveform.

38. A method to automatically optimize waveform captures, comprising:
- capturing at least one waveform using at least one waveform capture device;
- analyzing the captured at least one waveform to determine if the at least one captured waveform is capable of being compressed, while maintaining relevant attributes for characterization, analysis and/or other use;
- in response to determining the at least one captured waveform is capable of being compressed, while maintaining relevant attributes for characterization, analysis, and/or use, compressing the at least one captured waveform using at least one compression technique to generate at least one compressed waveform; and
- taking one or more actions based on or using the at least one compressed waveform.

* * * * *